United States Patent [19]

So

[11] Patent Number: 4,833,399
[45] Date of Patent: May 23, 1989

[54] DTMF RECEIVER

[75] Inventor: John L. W. So, Norcross, Ga.

[73] Assignee: Texas Instruments Incorporated, Dallas, Tex.

[21] Appl. No.: 206,156

[22] Filed: Jun. 13, 1988

[51] Int. Cl.⁴ ............................................. G01R 23/14
[52] U.S. Cl. ................................ 324/79 D; 324/79 R; 364/200
[58] Field of Search ............... 324/77 R, 77 A, 78 R, 324/79 R, 79 D, 78 D; 364/487, 488, 188, 200, 900

[56] References Cited

U.S. PATENT DOCUMENTS

| 4,445,177 | 4/1984 | Bratt et al. | 364/200 |
|---|---|---|---|
| 4,455,602 | 6/1984 | Baxter III | 364/200 |
| 4,493,027 | 1/1985 | Katz et al. | 364/200 |
| 4,525,780 | 6/1985 | Bratt | 364/200 |
| 4,570,217 | 2/1986 | Allen et al. | 364/900 |

Primary Examiner—Michael J. Tokar
Attorney, Agent, or Firm—Thomas R. FitzGerald; Leo N. Heiting; Melvin Sharp

[57] ABSTRACT

A DTMF receiver (10) recognizes each of a plurality of multi-frequency tones, each tone centered on a predetermined standard frequency. Two digital bandpass filters (14, 16) each have four frequency bins, each frequency bin operating according to a recursive second-order transfer function for preferentially transmitting frequencies near the standard frequencies. Each frequency bin accumulates, for each of a plurality of sampling periods, respective spectral energy signals from the input signal. A temporal energy signal is derived from the spectral energy signals. For each bandpass filter (14, 16), a time-domain test template generator (30) and a frequency-domain test template generator (34) are provided to generate time-domain and frequency-domain test templates. These test templates are input to an analyzer (38) that compares the templates against data-adaptive frequency-domain and time-domain reference templates.

33 Claims, 2 Drawing Sheets

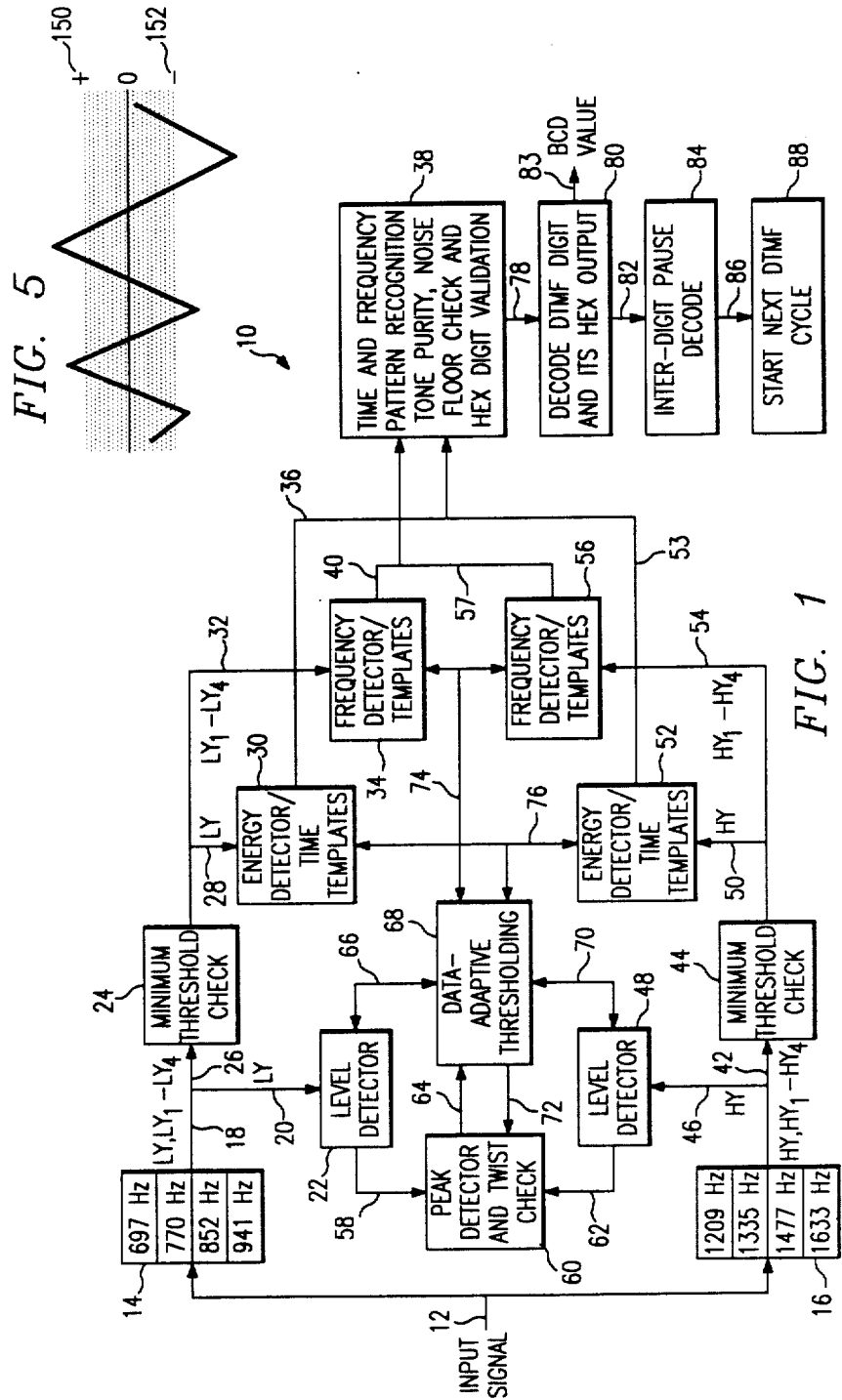

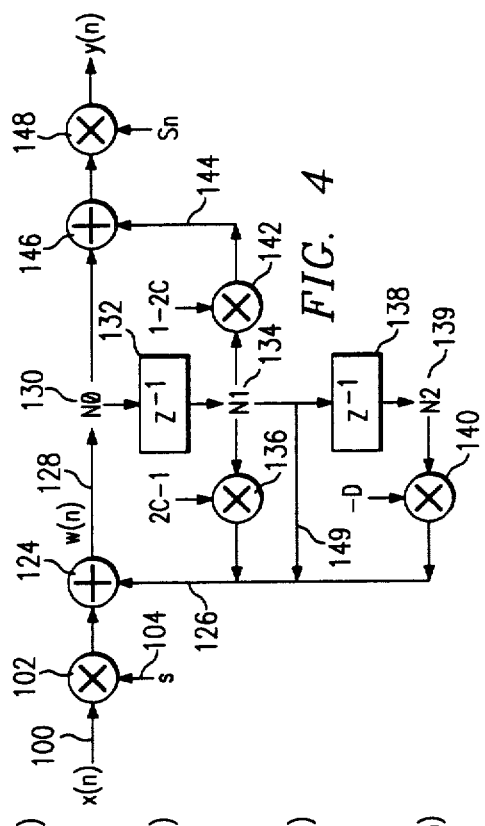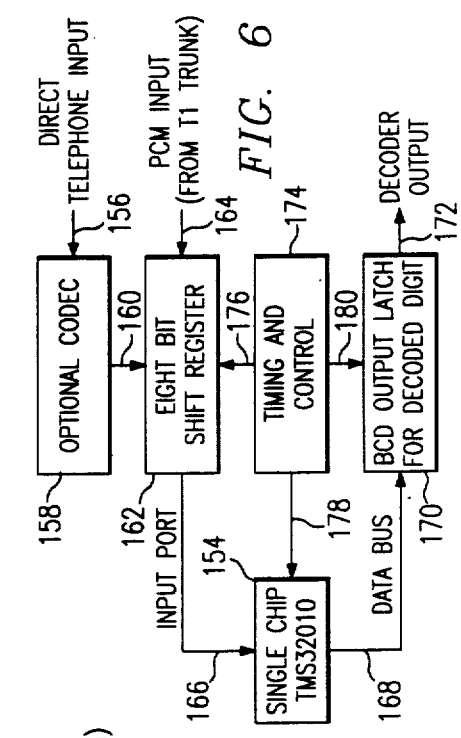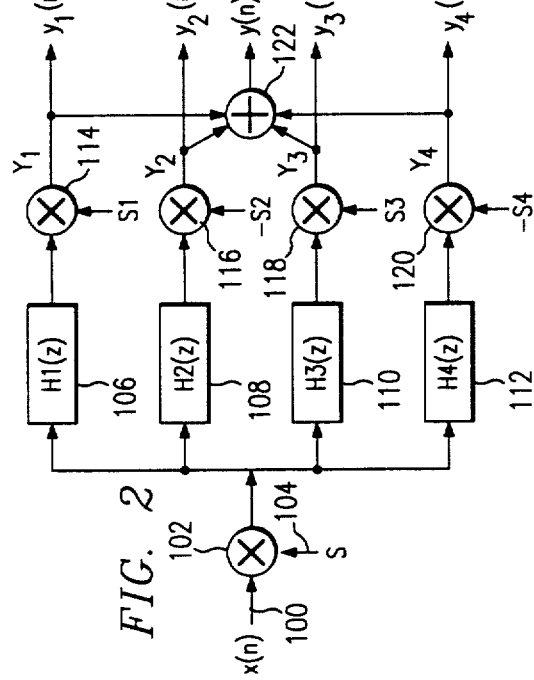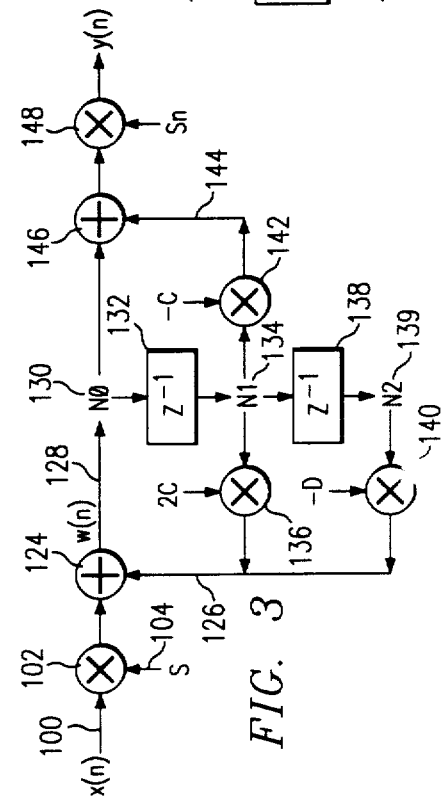

DTMF RECEIVER

BACKGROUND OF THE INVENTION

Introduced nearly three decades ago, DTMF (dual-tone multi-frequency) signaling has been widely used as a signaling method in telephone central offices, private branch exchanges, and private automatic branch exchange equipment. DTMF is also known under the mark TOUCH-TONE, a registered trademark of American Telephone and Telegraph Corporation. DTMF is also used for communications and in many other applications such as radio telephones, electronic tellers, banking/financial transactions via remote data entry, remote security and alarm activation systems, remote control systems, remote data-loggers, telemetry, toll-call restrictors, touch-tone to dial-pulse conversion and dial-pulse to touch-tone areas.

There are basically two types of DTMF receivers: analog and digital. Analog DTMF receivers typically require more support chips such as a CODEC and an eight-bit microcontroller. Digital DTMF receivers do not require as many support chips because the DTMF signal is already in digital form as PCM (pulse code modulation) data. Digital DTMF receivers can be incorporated into such digital signal processor chips as members of the Texas Instruments TMS320 family, which can handle PCM inputs without the use of a CODEC. The TMS320 can also act as a powerful controller.

Most existing DTMF decoders employ digital filtering techniques. Discrete Fourier transform, fast Fourier transform and other spectral and correlation techniques are both more time consuming and less desirable since standard DTMF tones are harmonically unrelated to each other.

Unfortunately, most digital filtering techniques require an excessively long cycle time for front-end filtering, leaving very little real time for post-detection digit validation and for other system software overhead. Also, filtering alone is not enough to distinguish between speech and valid DTMF digits in order to meet the AT&T standard specifications for digit simulations or talk-off performance. This is largely because speech signals have spectra spanning across the entire 4 KHz range. PCM data sampled at 8 KHz can only have a maximum bandwidth of 4 KHz in order to satisfy the sampling theorem. As a result, most commercial DTMF decoder chips do not perform well in digit simulations.

Therefore, a need has arisen for a digital DTMF receiver that can adequately discriminate between valid dual-tone pairs and other signal sources such as speech or noise, and further which has a sufficiently short cycle time to be useful for commercial applications.

SUMMARY OF THE INVENTION

According to one aspect of the invention, an apparatus for recognizing each of a plurality of multi-frequency tones is provided. Each of the tones is centered on a predetermined frequency. The apparatus includes a digital bandpass filter that has a plurality of frequency bins equal to the plurality of tones to be recognized. Each frequency bin preferentially transmits frequencies of the input signal near the predetermined frequencies, and accumulates, for each of a plurality of sampling periods, respective spectral energy signals from the preferentially transmitted frequencies. The filter further derives a temporal energy signal as a function of the preferentially transmitted frequencies for each of the sampling periods.

A time-domain test template generator is coupled to the filter for receiving the temporal energy signal and for generating a time-domain test template in response thereto. A frequency-domain test template generator receives the spectral energy signals for each of the sampling periods, and generates a frequency-domain test template in response thereto. An analyzer is coupled to the template generators to compare the test templates to at least one frequency-domain reference template and at least one time-domain reference template to determine the existence and identity of a predetermined multi-frequency tone.

Preferably, the apparatus comprises a DTMF receiver that includes a low-group bandpass filter and a high-group bandpass filter. Each filter applies a second-order recursive transfer function to preferentially filter frequencies near each of the four standard AT&T high group or low group frequencies, respectively. At least a high-group time-domain test template and a high-group frequency-domain test template are generated, as well as corresponding templates for the low frequency group. The frequency-domain test template is preferably created by counting the number of times the spectral energy signals exceed a predetermined, data-adaptive threshold for each frequency bin. This data adaptive threshold is preferably calculated as a function of the maximum of a plurality of the received temporal energy signal. A time-domain test template is preferably created as consecutive accumulations of the temporal energy signal for each of a plurality of sampling periods.

Preferably, the analyzer of the invention calculates a data-adaptive frequency-domain reference template in real time based on the peak spectral energy signal strength, and further performs tone purity and noise energy tests to determine the presence or absence of a valid DTMF digit. A data-adaptive time domain reference template is generated based on a predetermined acceptable transient response of the bandpass filter and consecutive accumulations of the temporal energy signal.

The present invention provides a significant technical advantage over conventional filtering systems in its use of an efficient and straightforward method for performing DTMF decoding. The present invention provides very efficient detection and recognition algorithms that reduce the digit detection and validation time down to a point where digital filtering becomes a feasible and commercially viable solution for DTMF decoding meeting AT&T specifications. It is believed that the combination of the filtering and data-adaptive pattern recognition aspects of the invention produce a DTMF receiver superior of existing DTMF decoding techniques. Finally, the invention can be applied to a commercially available DSP (digital signal processing) chip such as the TMS32010 to perform multi-channel DTMF decoding. All features provided by the invention are entirely software-programmable by changing the values of system parameters to adapt to the user's requirements.

BRIEF DESCRIPTION OF THE DRAWINGS

Further aspects of the invention and their advantages will be discerned by referring to the following detailed description when taken in conjunction with the drawings in which:

FIG. 1 is a schematic functional block diagram of a single-channel DTMF receiver according to the invention;

FIG. 2 is a signal flowgraph of either of a pair of eighth-order bandpass filters shown in FIG. 1;

FIG. 3 is a signal flowgraph of any of four second-order transfer functions of the frequency bins as shown in FIG. 2;

FIG. 4 is an alternative embodiment of any of the four second-order transfer functions as shown in FIG. 2;

FIG. 5 is an exemplary graph of signal strength over time showing the center clipping signal thresholding concept of the invention; and FIG. 6 is a schematic electrical block diagram showing one possible physical embodiment of the invention.

DETAILED DESCRIPTION

Referring first to FIG. 1, a schematic functional block diagram of a DTMF receiver according to the invention is shown generally at 10. An input signal is presented on input or T1 pathway 12 to a lower-tone bandpass filter 14 and in parallel to a higher-tone bandpass filter 16. The receiver of the illustrated embodiment is designed to recognize dual-tone multi-frequency signals produced by pressing a particular digit in a push-button telephone dial. According to dual-tone multi-frequency (DTMF) standard, a particular telephone button or digit is encoded into a pair of audio signals, one taken from a low group of frequencies illustrated within bandpass filter 14 and one taken from a high group of frequencies illustrated within bandpass filter 16. Therefore, the recognition of a pair of these discrete frequencies will allow the recognition of the encoded digit.

The design of bandpass filters 14 and 16 is an adaptation of the design described in the published 1978 Ph.D. thesis of the Applicant, "A Novel Design Technique and Hardware Implementation of Digital Filters For High-Speed Real-Time Digital Signal Processing", which is on file at the London University Library, London, Great Britain, and which is incorporated herein by way of reference. The function of bandpass filters 14 and 16 will be more particularly described in conjunction with FIGS. 2-4 below.

Bandpass filter 14 puts out five different signals on the output line 18. A first output LY represents the relative intensity of the entire received and filtered input audio signal within a predetermined sampling period. Four other signals, $LY_1-LY_4$, represent relative intensities of the filtered input signal at or near each of four preselected frequencies, in the illustrated embodiment 697, 770, 852 and 941 Hertz. LY is derived as a function of $LY_1-LY_4$, as will be described in more detail in conjunction with FIG. 2.

The temporal energy signal LY is communicated via a path 20 to a level detector 22, while signals LY and $LY_1-LY_4$ are transmitted to a minimum threshold checker 24 by a path 26. The output of minimum threshold checker 24 is connected through path 28 to an energy detector and time-domain test template generator 30, and through a path 32 to a frequency detector and frequency-domain test template generator 34. Detector/generator 30 generates a time-domain test template that is transmitted through a path 36 to a validation block 38 that incorporates time and frequency pattern recognition, tone purity, noise floor check and hex digit validation functions. Frequency detector/test template generator 34 is operable to transmit a frequency-domain test template through path 40 to block 38.

The functional blocks subsequent to bandpass filter 14 are mirrored in the functional blocks subsequent to bandpass filter 16. Filter 16 generates a relative intensity signal HY from the intensity of the entire received and filtered input audio signal, and further generates four spectral energy signals $HY_1-HY_4$ corresponding to the relative intensities of the filtered input signal at or near 1209, 1335, 1477 and 1633 Hertz. HY is derived as a function of $HY_1-HY_4$. The output information from bandpass filter 16 is communicated through a path 42 to a minimum threshold checker 44 that is similar to minimum threshold checker 24. The temporal energy signal HY is communicated through a path 46 to a level detector 48. Minimum threshold checker 44 is operable to pass the HY signal through a path 50 to an energy detector/time domain test template generator 52 that is similar in its organization to time-domain test template generator 30. Output signals $HY_1-HY_4$ are communicated from the output of minimum threshold checker 44 through a path 54 to a spectral signal detector/frequency-domain test template generator 56 that is similar in its organization to detector/generator 34.

An output of level detector 22 is connected through a path 58 to a peak detector and twist checker 60. Likewise, an output of level detector 48 is connected through a path 62 to peak detector and twist checker 60. Peak detector/twist checker 60 compares the relative intensities of the signals received on paths 58 and 62 and outputs a flag on an output 64 to a data-adaptive threshold generator 68.

A path 66 connects level detector 22 to data-adaptive threshold generator 68. A similar path 70 connects level detector 48 to data-adaptive threshold generator block 68. Threshold generator 68 has one output that is connected through a path 72 to peak detector and twist checker 60, a second output connected via a path 74 to frequency detector/frequency-domain test template generators 34 and 56, and a third output connected through a path 76 to energy detector/time-domain test template generators 30 and 52.

Recognition block 38 has an output connected through a path 78 to a DTMF digit decoder 80. Decoder 80 has a BCD I/O port 83. Another output of DTMF digit decoder 80 is connected through a path 82 to an inter-digit pause decoder 84. Inter-digit pause decoder 84 has an output that is connected through a path 86 to a DTMF cycle initiator 88.

Turning now to FIG. 2, a flow graph corresponding to either bandpass filter 14 or bandpass filter 16 is schematically shown. The input signal x(n) is input on path 100 to scaling node 102. The signal has a scaler S applied to it through path 104 at this node. The scaled input signal is then input in parallel to each of four separate frequency bins or resonators, incorporating respective transfer functions $H_1(z)-H_4(z)$ and represented respectively by blocks 106, 108, 110 and 112. The output of these transfer functions are input to respective scaling nodes 114–120, to which magnitude scalers $S_1$, $-S_2$, $S_3$ and $-S_4$ are respectively applied. The application of scaling factors $S_1-S_4$ yields frequency intensity outputs $y_1(n)-y_4(n)$. These outputs are individually output to the next function of receiver 10, and in addition are summed at node 122 to produce overall value y(n).

The transfer function for each second-order frequency bin or section 106–112 is given below:

$$H(z) = \frac{1 - e^{-aT}\cos(bT)z^{-1}}{1 - 2e^{-aT}\cos(bT)z^{-1} + e^{-2aT}z^{-2}}$$

Substituting $C = e^{-aT}\cos bT$ and $$D = e^{-2aT},$$

the transfer function can be reduced to the following:

$$H(z) = \frac{1 - Cz^{-1}}{1 - 2Cz^{-1} + Dz^{-2}}$$

In the above equations, $e^{-aT}$ is the pole radius of each complex pole pair. a is equal to half of the bandwidth of each frequency bin. b is the center frequency of each frequency bin 106–112, and T is the sampling period.

The signal flowgraph of each second order bin 106–112 is schematically shown in FIG. 3. In FIGS. 2–4, like numbers identify like nodes and functions wherever possible. As before, x(n) is input on path 100 to a node 102, at which an input scaling factor (S) is applied through path 104. The scaled signal is then input to a summation node 124 where it is summed with components provided from a path 126. A summed output proceeds on a path 128 to a node 130 and further on to a summation node 146. The signal at node 130 is fed through a first delay 132 to node 134. The signal at node 134 is scaled by quantity (2C) at node 136 and summed through path 126 to the input at node 124. The signal at node 134 is also subjected to a further delay at 138 to appear at a node 139. This twice-delayed signal is scaled at node 140 by (−D) and is added back to the input through path 126.

The once-delayed signal at node 134 is also scaled at node 142 by quantity (−C). This quantity then is input by path 144 to summation node 146. The output of summation 146 is scaled at node 148 by an output scaler Sn to yield the output y(n).

FIG. 4 illustrates an alternative embodiment of one second-order bin or resonator. The shown flow graph is a modification in order to implement 32 bits of arithmetic precision and to avoid number representation and storage problems of the bin structure shown in FIG. 3. These problems occur when the value for scaling factor (C) closely approaches one. The following substitute transfer function avoids these number representation problems:

$$H(z) = \frac{1 + (1 - 2e^{-aT}\cos bT)z^{-1}}{1 - (2e^{-aT}\cos bT - 1 + 1)z^{-1} + e^{-2aT}z^{-2}}$$

Again substituting in C and D, this equation reduces to $$H(z) = \frac{1 + (1 - 2C)z^{-1}}{1 - (2C - 1 + 1)z^{-1} + Dz^{-2}}$$

The resulting flow graph shown in FIG. 4, is essentially the same as that shown in FIG. 3, except that the scaling quantity (2C) in FIG. 3 is replaced by a scaling quantity (2C−1), and the sacaling quantity (−C) is replaced by a scaling quantity (1−2C). An extra path 149 is also added as an input to the summation mode 124.

HARDWARE IMPLEMENTATION

FIG. 6 is one possible schematic electrical block diagram of a physical implementation of a DTMF receiver according to the invention. The decoder system illustrated is a single-channel system, and can easily be expanded to multiple channels. The system is built around a TMS32010 digital signal processor chip 154. Chip 154 is programmed with the computer program to be described in more detail below. This program is written in TMS32010 assembly language.

A direct telephone input 156 is connected to an optional CODEC 158, which in turn has an output 160 that is input into an eight-bit shift register 162. In the place of or in addition to direct telephone input 156, a PCM input 164 can be provided from a T1 digital carrier trunk. Shift register 162 is used to convert the serial PCM input data to parallel data that can be placed on input port 166 of chip 154. Recognized digits are output on data bus 168 from chip 154 to a BCD output latch 170 for storing the decoded digit. Latch 170 has a decoder output 172.

A timing and control block 174 is connected through paths 176, 178 and 180 respectively to shift register 162, chip 154 and output latch 170. Timing and control block 174 provides essential timing and clock signals to ensure proper operation of the system hardware.

OPERATION

The operation of the receiver of the invention can best be described with particular reference to FIG. 1. The signal input on input 12 is preferably subsampled at 4 KHz and is appropriately scaled.

To do this, the input 8 KHz PCM data are decimated without an anti-aliasing filter. The subsampling process of the PCM input creates aliasing for speech samples only. The intentional aliasing thus produced will also help in reducing digit simulations by non-DTMF signals. This is due to the fact that speech has a bandwidth wider than 2 KHz (the folding frequency of a digital system sampling at 4 KHz) and extends to 4 KHz and beyond in voiced segments. For unvoiced segments, speech appears as a wide band Gaussian noise that is only a band-limited by the input codec or PCM bandwidth. The net result of this aliasing effect on the speech signal is that more of the higher frequency speech energy will fall into the individual frequency bins. Under this condition, the speech signal will take on a different identity than that of a dual-tone DTMF pair, which has most of its energy concentrated in one bin per frequency group.

On the other hand, since all DTMF frequencies (less than 1633 Hz) are below 2 KHz, the DTMF samples are sampled above the theoretical minimum sampling rate, resulting in no aliasing effects. This is also true even when the DTMF tones are pulsed with 40 milliseconds on/off time periods. In this last case, the frequency response of the tone pair will be made up of narrowband sinc functions centered at the respective tone frequencies. The main lobes of these sinc functions are normally very visible to the frequency detector while their side lobes are relatively "masked" out due to the frequency separation or resolution of the frequency bins.

Signal 12 is applied to bandpass filter 14, which in the preferred embodiment consists of four second-order bins that are tuned to the four standardized DTMF low frequencies. Each bin incorporates a second-order recursive filter transfer function of the type described in conjunction with FIGS. 3 and 4. Similarly, the signal is input into bandpass filter 16, which has four second-order bins that are tuned to each of the four standard high DTMF frequencies. The bandpass filters 14 and 16 will reject all frequency components of the input signal that are not at or near the specified frequencies. Preferably, the bandwidth tolerance around each specified frequency falls in the range of ±1.5% to ±3.5%.

Bandpass filter 14 outputs five digital numbers for each sampling period. The sampling period in the illustrated embodiment is one-fourth of a millisecond. A value LY is derived as a function of the filtered energy signals $LY_1-LY_4$ of the four frequency bins.

The value LY is passed to the minimum threshold checker 24 to determine whether there is sufficient energy to warrant further processing. If LY is not of a certain predetermined magnitude, minimum threshold checker 24 will issue a flag that will abort the rest of the DTMF signal analysis. When such a flag is issued, system 10 will await the input of the next sample.

Value Ly is also transmitted via path 20 to a level detector 22. Level detector 22 uses LY to determine the magnitude of the input signal as filtered by low-tone bandpass filter 14. This magnitude is applied through path 58 to peak detector and twist checker 60 and the data-adaptive threshold generator 68 through path 66.

Value LY is also applied through paths 18, 26 and 28 to the energy detector/time test template generator 30. Detector 30 will accumulate the received temporal energy signals for each of at least three ten-millisecond intervals. These consecutive energy accumulations $ELY_1$, $ELY_2$ and $ELY_3$ constitute a time-domain test template, which will be transmitted via path 36 to the time and frequency pattern recognition block 38. In an alternative embodiment, energy accumulations $ELY_1$, $ELY_2$, $ELY_3$ and $ELY_4$, from four adjacent ten-millisecond intervals, could be used to generate the test template, but this has been found not to be necessary for meeting standard DTMF tone recognition requirements.

Frequency bin output signals $LY_1-LY_4$ are transmitted through paths 18, 26 and 32 to a frequency domain detector/test template generator 34. Frequency domain detector 34 samples each of the signals $LY_1-LY_4$ each 250 microseconds, and counts the number of times that these signals exceed a calculated data-adaptive threshold inside a 40-millisecond period. One count will be accumulated for $LY_1$, a second count will be accumulated for $LY_2$, a third count will be accumulated for $LY_3$ and a fourth count will be accumulated for $LY_4$. Frequency detector 34 thus generates a frequency domain template that consists of four counts, one count for each of the four frequency bins of bandpass filter 14.

The processing of the input signal through high-tone bandpass filter 16 is similar to the processing described above for lower-tone bandpass filter 14. Bandpass filter 16 will generate an overall energy intensity value HY, and particular frequency bin output values $HY_1-HY_4$ that correspond to each of the standard DTMF high frequencies. Value HY is transmitted via path 46 to level detector 48. The magnitude of HY is in turn fed through path 62 to peak detector and twist checker 60, and also to data-adaptive threshold generator 68 through path 70.

Peak detector and twist checker 60 samples HY and LY a plurality of times, such as eight successive times, and chooses a peak HY value and a peak LY value. Peak detector and twist checker 60 then compares the peak magnitude of LY to the peak magnitude of HY. The difference between these magnitudes, called "twist", must not exceed certain predetermined specifications. If this difference does exceed a certain predetermined limit, the twist checker 60 will issue an abort flag and the system will be reset to receive the next input signal.

The peak magnitudes of HY and LY are also used by data adaptive threshold generator 68 to generate thresholds which in the illustrated embodiment are simple percentages of these magnitudes. Thresholding block 68 is important because the input signal can have a dynamic range of approximately 25 decibels. In the illustrated embodiment, percentages of the peaks are used to establish higher-tone and lower-tone thresholds. The higher-tone threshold is transmitted through path 74 to higher-tone detector 56, and the lower-tone threshold is transmitted through path 74 to lower-tone detector 34. A third threshold is derived from the peak values of both HY and LY, and is transmitted to both time-domain template generators 30 and 52 on path 76. In an alternative embodiment, separate thresholds could be generated for each frequency component and each time-domain generator, but for standard telephone applications this has been determined not to be necessary.

Value HY is transmitted through paths 42 and 50 to detector 52, where it is used to generate a time-domain high-frequency test template that in turn is transmitted through path 53 to recognition block 38. Components $HY_1-HY_4$ are transmitted through paths 42 and 54 to frequency detector/test template generator 56, which uses these components to generate a frequency-domain test template similar to the one generated for the low frequencies by generator 34. The frequency-domain test template is communicated through path 57 to recognition block 38.

Recognition block 38 thus receives two time domain test templates and two frequency-domain test templates for each valid unaborted 40-millisecond interval. Recognition block 38 then compares these templates against respective time- and frequency-domain reference templates to identify whether a valid DTMF signal has been received. The time-domain reference templates are sets of energy accumulations derived from the corresponding energy accumulations in the test templates and known ratios $ELY_1/ELY_2$, $ELY_2/ELY_3$, etc. of an acceptable bandpass filter transient response. Each set has the same number of ratios as the time-domain test template it is compared against. Block 38 preferably contains the following checks of the signal.

1. Adaptive Time-Profile Check. Six of the eight 10 msec. components of the two 40 msec. time-domain test templates are compared with known reference templates by way of a ratio test of the time-domain transient responses of the bandpass filters. Individually tailored reference thresholds are assigned to each of the eight time bins for this comparison process. The decision-making process is dependent on predetermined acceptable transient filter responses to DTMF tone and speech inputs.

2. Data-Adaptive Frequency Domain Reference Template Generation. Each frequency-domain test template will have a peak value in one of its frequency bins that exceeds the values in the other frequency bins. This peak value, or main lobe of the signal, is detected and used to generate the frequency-domain reference thresholds discussed below.

3. Data-Adaptive Noise Floor Generation. A data-adaptive noise floor is generated by block 38 based on the energy of the main lobe or peak value of each DTMF frequency-domain test template. Associated with this adaptive noise floor are two pairs of thresholds. A pair of thresholds is assigned for the maximum allowed noise energy in the high- and low-frequency groups for a given signal-to-noise ratio. Another pair of maximum "spillover" thresholds are also generated as a function of the main lobe. These spillover thresholds are issued for the maximum allowed energy in each side lobe, or non-peak frequency bin, of the frequency test templates.

4. Tone Purity Check. A check of the individual second-order frequency bins must also indicate that there is only one distinct frequency component present in each of the two frequency-domain test templates. To achieve this, the spillover thresholds generated above are applied respectively to the low-frequency and the high-frequency group of bins. A further check is performed to make sure that at least two of the side lobes per frequency domain templates have energies below a certain threshold. If this is not the case, a noise energy test is next conducted.

5. Noise Energy Test. For each frequency group, contingent on the result of the tone purity check, a noise energy check may be performed using the data-adaptive noise energy thresholds generated in step 3. This check sums the three non-peak counts of the frequency-domain test template and compares the sum against a calculated threshold. If the sum exceeds this threshold, the current digit is rejected.

If the test templates meet the above test block 38 will validate that a DTMF digit consisting of a tone pair has been received. The output of block 38 will cause block 80 to generate a decoded BCD value that corresponds to the detected tone pair. This BCD value will be output to an I/O port 83.

Time and frequency pattern recognition block 38 is also connected through paths 78 and 82 to an inter-digit pause decoder 84. This block is operable to verify that the energy of a dual-tone digit has died down to a sufficient level, typically within six milliseconds of the initial tone decay. At this stage, in the illustrated embodiment, decoder 84 starts a 34-millisecond active time delay to complete the inter-digit interval of 40 milliseconds. Upon sensing such an inter-digit interval, block 84 will send a signal on path 86 to initiator 88 to re-initialize the next DTMF reception cycle.

TIMING AND CONTROL

If no energy is detected over a period of eight samples, a line dropout condition is recognized and the system is reset. When energy is detected, a 40-millisecond software timer is started. The energy detector and the frequency detector embodied in chip 154 will accumulate information over this 40-millisecond interval. A tone may be detected at the end of this period. Also, the tone must be tracked since it could last for much longer than 40 milliseconds. A tone longer than 40 milliseconds should not cause multiple DTMF decoding operations as this would result in the detection of multiple key strokes. The software timing and control further ensure that there is an inter-digit pause or gap between the tones of at least 40 milliseconds.

FIG. 5 illustrates the manner in which signals are counted above (and below) a certain threshold. The input signal received on input 12 has both high and low peaks. Therefore, HY, $HY_1-HY_4$, LY and $LY_1-LY_4$ may take either positive or negative values. The thresholding data supplied by data-adaptive threshold generator 68 sets a positive limit shown at 150 at FIG. 5, and further sets a mirror-image negative limit at 152. The points between these positive and negative limits will not be considered by detector/template generators 30, 34, 52 and 56.

SOFTWARE IMPLEMENTATION

Most of the functions of the DTMF receiver are provided through programming a TMS32010 chip with appropriate software. A preferred source code listing is set out below, preceded by a description of the program sections by their subtitles.

The following program sections are used to initialize the program variables and to set up the RAM of the TMS32010 chip:

DATA RAM MAP
SYSTEM RESET VECTOR
SYSTEM INITIALIZATION TABLE
DTMF DIGIT DECODE TABLE
INITIALIZE SYSTEM DATA RAM AND CONSTANTS
INITIALIZE SYSTEM HEX DIGIT DISPLAY
INITIALIZE DTMF FLAGS AND COUNTERS
INITIALIZE ADAPTIVE ENERGY FRAMES
INITIALIZE ADAPTIVE THRESHOLDS

DATA RAM MAP

This section reserves space in the TMS32010 DATA RAM for all of the system variables and labelled constants used in each module.

SYSTEM INITIALIZATION TABLE

This section is a table of initial values to be stored in the locations reserved for them in the DATA RAM MAP upon system initialization.

DTMF DIGIT DECODE TABLE

This table is a table of values that is indexed in assigning a digit value to a decoded DTMF.

SYSTEM INITIALIZATION

This section of the code transfers the values in the system initialization table in program memory to the data memory locations declared in the data RAM map.

THRESHOLD INITIALIZATION

This section initializes the adaptive thresholds and energy frames.

CODEC INPUT BIOWAIT LOOP

The program waits here for an input sample from the CODEC. Note that every other sample is discarded. By this method, the processing rate of the DTMF system is effectively 4 KHz, even though the CODEC is running at 8 KHz.

DTMF TONE DETECTION AND ASSOCIATED PROCESSING

This section comprises the bulk of the DTMF decoding routine and consists of eleven sub-modules that perform a variety of functions. Each of these sub-modules is described below.

CALL HIGH/LOW GROUP FILTERS

This sub-module calls the bandpass filter subroutines (later described) and is represented in FIG. 1 by filters 14 and 16.

TRACK INPUT SIGNAL ENERGY

This function is likewise represented in FIG. 1 by filters 14 and 16. This section tracks the input signal energy and the outputs of the filters are saved for use later.

TRACK INPUT SIGNAL SWING/PEAK INFORMATION

This sub-module is represented in FIG. 1 by detectors 22, 48 and 60, and saves the low-group peaks and the high-group peaks in variables ADJL and ADJH respectively. The peaks will be later used in calculation of the data-adaptive thresholds.

FRAME ENERGY PROCESSING FOR FIRST 40 MS. DURATION

This sub-module corresponds to detector/generators 30 and 52, and examines the four 10 msec. frames which make up a 40-millisecond period. The energy in each frame is stored in locations ELY1-ELY4 and EHY1-EHY4 respectively for the low-group and the high-group signals.

TWIST TEST

This sub-module is incorporated into block 60 of FIG. 1, and compares the two peak values to verify that their difference (twist) is less than a preset maximum value. Optionally, this twist test can be modified to check on other twist limits. If the twist threshold is exceeded, the tones are considered to be invalid and an appropriate flag is issued.

MINIMUM INPUT SIGNAL LEVEL TEST

This sub-module is represented in FIG. 1 by blocks 24 and 44, and compares the peaks against a fixed minimum level MINTHR, which can be set to any desired value. In the program set forth, MINTHR is set to −25 dB.

CALCULATE DATA ADAPTIVE THRESHOLDS FOR TONES

This sub-module is represented in FIG. 1 by blocks 30, 34, 52 and 56. This sub-module employs an adaptive thresholding technique to adapt to dynamic line conditions and varying signal strengths. The thresholds are updated after monitoring the peak levels over a number of samples. One level of thresholds is used for the eighth-order results input into blocks 30 and 52 (FIG. 1), and two other levels of thresholds are used for the frequency bin results input into blocks 34 and 56. The adaptive thresholds calculated with the multiplicative constant THRADJ at this point in the detection process are used first for the determination of tone presence in the low-group and the high-group. Next, the other adaptive thresholds are used to sort the second-order frequency bin outputs by updating the respective frequency counters.

CHECK FOR THE END OF DTMF TRANSMISSION

This sub-module is represented by block 84 in FIG. 1. Between each valid DTMF character received, there is required a minimum 40-millisecond inter-digit pause. During this period, the DTMF receiver does not decode tones. To implement this requirement, one may either simply halt DTMF processing for the required period of time after each valid decode, or, one may continue to process the incoming signal and make sure that there exists an inter-digit pause of no DTMF transmission.

THRESHOLD DTMF FREQUENCY BIN OUTPUTS

This sub-module is incorporated into block 38 of FIG. 1. If the tone has been present for a minimum period of 40 milliseconds, the program will check the contents of each of the frequency counters to determine which tones are present. THRHL is the minimum count for tone present, and is initialized to 60. Threshold LOLIM is the maximum spillover account for the low group, and is initialized to zero. Threshold HILIM is the maximum spillover count for the high frequency group, and is likewise initialized to zero. The maximum spillover counts are used to make sure that the true DTMF tones will not exceed the maximum allowed side lobe values for the low-frequency group and the high-frequency group. In the case of speech and other non-DTMF signals on the telephone line, these values will be exceeded. By changing these present counts, the user can easily relax or tighten the DTMF receiver tone acceptance criteria.

DTMF DIGIT DECODER

This module is incorporated into block 38 of FIG. 1, and does the decoding and checking for the presence of DTMF signals. A discussion of each sub-module in this module follows.

LOW-GROUP TONE DECODE

An adaptive profile check is done for the four low-group frequency bins. This adaptive check is based on the energy stored in the first three frames of the 40-millisecond DTMF transmission. The test compares the energy in these frames to see if there has been too much change between them compared to reference frames. If there is too much change, then the frequency bin is rejected as not having any DTMF energy present.

CALCULATE ADAPTIVE NOISE FLOOR/ENERGY FOR LOW-GROUP

The adaptive noise floor is calculated based on the tone count TESTL.

CHECK FOR PRESENCE OF ONLY ONE TONE IN LOW-GROUP

If there is only one frequency counter in each group that meets the minimum requirements of a DTMF tone, the corresponding hex digit is output to the output data bus 168 (FIG. 6) of the TMS32010.

LOW-GROUP ADAPTIVE NOISE ENERGY CHECK

If there is too much energy in all four frequency bins, the signal is rejected and no DTMF tone is recognized.

HIGH-GROUP TONE DECODE, CALCULATE ADAPTIVE NOISE FLOOR/ENERGY FOR HIGH-GROUP, CHECK FOR PRESENCE OF ONLY ONE TONE IN HIGH-GROUP

These sub-modules are identical to the corresponding low-group sub-modules discussed immediately above with appropriate changes in the variable names.

SUBROUTINE H DIGIT (LOOK UP DECODED HEX DIGIT FROM HEX TABLE)

This subroutine uses a table to look up the hex digit decoded from the table.

SUBROUTINE JB EDIT (OUTPUT DECODED HEX DIGIT)

This subroutine outputs the hexadecimal digit to display hardware.

SUBROUTINE HILOW (LOW-GROUP/HIGH-GROUP BANDPASS FILTERS)

This subroutine corresponds to blocks 14 and 16 in FIG. 1, and contains the bandpass filters for the low- and high-frequency groups. The filter taps provide the second-order outputs and the eighth-order results are obtained in this subroutine also.

SUBROUTINE CODEC (CODEC INPUT ROUTINE)

This subroutine reads in the PCM data from the CODEC and performs the logarithmic-to-linear 13-bit two's complement conversion using the CODEC-to-linear conversion table.

SOURCE CODE

HIGH-GROUP TONE DECODE, CALCULATE ADAPTIVE NOISE FLOOR/ENERGY FOR HIGH-GROUP, CHECK FOR PRESENCE OF ONLY ONE TONE IN HIGH-GROUP

These sub-modules are identical to the corresponding low-group sub-modules discussed immediately above with appropriate changes in the variable names.

SUBROUTINE H DIGIT (LOOK UP DECODED HEX DIGIT FROM HEX TABLE)

This subroutine uses a table to look up the hex digit decoded from the table.

SUBROUTINE JB EDIT (OUTPUT DECODED HEX DIGIT)

This subroutine outputs the hexadecimal digit to display hardware.

SUBROUTINE HILOW (LOW-GROUP/HIGH-GROUP BANDPASS FILTERS)

This subroutine corresponds to blocks 14 and 16 in FIGURE 1, and contains the bandpass filters for the low- and high-frequency groups. The filter taps provide the second-order outputs and the eighth-order results are obtained in this subroutine also.

SUBROUTINE CODEC (CODEC INPUT ROUTINE)

This subroutine reads in the PCM data from the CODEC and performs the logarithmic-to-linear 13-bit two's complement conversion using the CODEC-to-linear conversion table.

SOURCE CODE

```
*****************************************************************
*                                                               *
*       A TMS32010-BASED ADVANCED DTMF DETECTOR/DECODER         *
*                                                               *
*       COPYRIGHT 1988 BY TEXAS INSTRUMENTS INCORPORATED        *
*                                                               *
*****************************************************************
*
        IDT 'ADTMF'
        TITL 'ADVANCED DTMF DECODER RELEASE 1.2'
        OPTION XREF
*
*****************************************************************
*                                                               *
*       THE CENTRE FREQUENCIES OF THE DTMF BINS ARE:            *
*                                                               *
*       697 HZ    (a=8.0)          1209 HZ    (a=12.0)          *
*       770 HZ    (a=9.0)          1336 HZ    (a=14.0)          *
*       852 HZ    (a=10.0)         1477 HZ    (a=16.0)          *
*       941 HZ    (a=11.0)         1633 HZ    (a=18.0)          *
*                                                               *
*****************************************************************
*
        DORG 0
*
*****************************************************************
*       DATA RAM MAP                                            *
*****************************************************************
*
*       CONSTANTS AND COUNTERS
*
ONE     DATA 0          ARITHMETIC CONSTANT 1
LOGTBL  DATA 0          LOCATION FOR CODEC TABLE
PAUSE   DATA 0          FLAG FOR CHECKING INTER-DIGIT PAUSE
STOP.   DATA 0          FLAG FOR END OF 10MS FILTER TRANSIENTS
GAP     DATA 0          FLAG FOR END OF 40MS DTMF TONE BURST
THRADJ  DATA 0          THRESHOLD ADAPTATION PARAMETER (8TH H/L)
THRADL  DATA 0          THRESHOLD ADAPTATION PARAMETER (2ND LG)
THRADH  DATA 0          THRESHOLD ADAPTATION PARAMETER (2ND HG)
MINCNT  DATA 0          SAMPLE COUNT FOR LINE ENERGY CHECK
MINTHR  DATA 0          THRESHOLD FOR MINIMUM SIGNAL ENERGY
SIGCNT  DATA 0          SIGNAL COUNTER FOR TRACKING DTMF TONE
SCNT    DATA 0          MINIMUM SIGNAL COUNT FOR DTMF ON-TIME
CNTR    DATA 0          TEMPORARY SYSTEM COUNTER
CNTR1   DATA 0          TEMPORARY SYSTEM COUNTER
CNTR2   DATA 0          TEMPORARY SYSTEM COUNTER
*
*       RAM FOR FIXED AND ADAPTIVE THRESHOLDS
*
THRSH8  DATA 0          HIGH-GROUP/LOW-GROUP FILTER THRESHOLD
THRHI   DATA 0          HIGH-GROUP FREQUENCY BIN THRESHOLD
THRLO   DATA 0          LOW-GROUP FREQUENCY BIN THRESHOLD
ADJL    DATA 0          LOW-GROUP THRESHOLD ADJUST VALUE
ADJH    DATA 0          HIGH-GROUP THRESHOLD ADJUST VALUE
THRHL   DATA 0          MINIMUM COUNT FOR TONE PRESENT
LOLIM   DATA 0          MAXIMUM SPILLOVER COUNT FOR LOW-GROUP
HILIM   DATA 0          MAXIMUM SPILLOVER COUNT FOR HIGH-GROUP
*
```

```
*       RAM FOR INPUT AND SCALING CONSTANT
*
X       DATA 0          SCALED INPUT DATA.
*
*       RAM FOR LOW-GROUP BANDPASS FILTER
*
LS      DATA 0          LOW-GROUP BANDPASS INPUT SCALER
LS1     DATA 0          LOW-GROUP #1 FREQUENCY BIN OUTPUT SCALER
LS2     DATA 0          LOW-GROUP #2 FREQUENCY BIN OUTPUT SCALER
LS3     DATA 0          LOW-GROUP #3 FREQUENCY BIN OUTPUT SCALER
LS4     DATA 0          LOW-GROUP #4 FREQUENCY BIN OUTPUT SCALER
*
L1C     DATA 0          LOW-GROUP BANDPASS FILTER COEFFICIENT #1
L1D     DATA 0          LOW-GROUP BANDPASS FILTER COEFFICIENT #2
L2C     DATA 0          LOW-GROUP BANDPASS FILTER COEFFICIENT #3
L2D     DATA 0          LOW-GROUP BANDPASS FILTER COEFFICIENT #4
L3C     DATA 0          LOW-GROUP BANDPASS FILTER COEFFICIENT #5
L3D     DATA 0          LOW-GROUP BANDPASS FILTER COEFFICIENT #6
L4C     DATA 0          LOW-GROUP BANDPASS FILTER COEFFICIENT #7
L4D     DATA 0          LOW-GROUP BANDPASS FILTER COEFFICIENT #8
*
LY      DATA 0          LOW-GROUP BANDPASS FILTER OUTPUT
LY1     DATA 0          LOW-GROUP #1 FREQUENCY BIN OUTPUT
LY2     DATA 0          LOW-GROUP #2 FREQUENCY BIN OUTPUT
LY3     DATA 0          LOW-GROUP #3 FREQUENCY BIN OUTPUT
LY4     DATA 0          LOW-GROUP #4 FREQUENCY BIN OUTPUT
*
L1N1    DATA 0          LOW-GROUP BANDPASS FILTER DELAY #1
L1N2    DATA 0          LOW-GROUP BANDPASS FILTER DELAY #2
L2N1    DATA 0          LOW-GROUP BANDPASS FILTER DELAY #3
L2N2    DATA 0          LOW-GROUP BANDPASS FILTER DELAY #4
L3N1    DATA 0          LOW-GROUP BANDPASS FILTER DELAY #5
L3N2    DATA 0          LOW-GROUP BANDPASS FILTER DELAY #6
L4N1    DATA 0          LOW-GROUP BANDPASS FILTER DELAY #7
L4N2    DATA 0          LOW-GROUP BANDPASS FILTER DELAY #8
*
*       RAM FOR HIGH-GROUP BANDPASS FILTER
*
HS      DATA 0          HIGH-GROUP BANDPASS INPUT SCALER
HS1     DATA 0          HIGH-GROUP #1 FREQUENCY BIN OUTPUT SCALER
HS2     DATA 0          HIGH-GROUP #2 FREQUENCY BIN OUTPUT SCALER
HS3     DATA 0          HIGH-GROUP #3 FREQUENCY BIN OUTPUT SCALER
*
HS4     DATA 0          HIGH-GROUP #4 FREQUENCY BIN OUTPUT SCALER
*
*
H1C     DATA 0          HIGH-GROUP BANDPASS FILTER COEFFICIENT #1
*
H1D     DATA 0          HIGH-GROUP BANDPASS FILTER COEFFICIENT #2
*
H2C     DATA 0          HIGH-GROUP BANDPASS FILTER COEFFICIENT #3
*
H2D     DATA 0          HIGH-GROUP BANDPASS FILTER COEFFICIENT #4
*
H3C     DATA 0          HIGH-GROUP BANDPASS FILTER COEFFICIENT #5
*
```

| | | |
|---|---|---|
| H3D | DATA 0 | HIGH-GROUP BANDPASS FILTER COEFFICIENT #6 |
| * | | |
| H4C | DATA 0 | HIGH-GROUP BANDPASS FILTER COEFFICIENT #7 |
| * | | |
| H4D | DATA 0 | HIGH-GROUP BANDPASS FILTER COEFFICIENT #8 |
| * | | |
| * | | |
| HY | DATA 0 | HIGH-GROUP BANDPASS FILTER OUTPUT |
| HY1 | DATA 0 | HIGH-GROUP #1 FREQUENCY BIN OUTPUT |
| HY2 | DATA 0 | HIGH-GROUP #2 FREQUENCY BIN OUTPUT |
| HY3 | DATA 0 | HIGH-GROUP #3 FREQUENCY BIN OUTPUT |
| HY4 | DATA 0 | HIGH-GROUP #4 FREQUENCY BIN OUTPUT |
| * | | |
| H1N1 | DATA 0 | HIGH-GROUP BANDPASS FILTER DELAY #1 |
| H1N2 | DATA 0 | HIGH-GROUP BANDPASS FILTER DELAY #2 |
| H2N1 | DATA 0 | HIGH-GROUP BANDPASS FILTER DELAY #3 |
| H2N2 | DATA 0 | HIGH-GROUP BANDPASS FILTER DELAY #4 |
| H3N1 | DATA 0 | HIGH-GROUP BANDPASS FILTER DELAY #5 |
| H3N2 | DATA 0 | HIGH-GROUP BANDPASS FILTER DELAY #6 |
| H4N1 | DATA 0 | HIGH-GROUP BANDPASS FILTER DELAY #7 |
| H4N2 | DATA 0 | HIGH-GROUP BANDPASS FILTER DELAY #8 |
| * | | |
| * | DTMF FREQUENCY BIN COUNTERS | |
| * | | |
| F1 | DATA 0 | LOW-GROUP FREQUENCY COUNTER #1 |
| F2 | DATA 0 | LOW-GROUP FREQUENCY COUNTER #2 |
| F3 | DATA 0 | LOW-GROUP FREQUENCY COUNTER #3 |
| F4 | DATA 0 | LOW-GROUP FREQUENCY COUNTER #4 |
| F5 | DATA 0 | HIGH-GROUP FREQUENCY COUNTER #1 |
| F6 | DATA 0 | HIGH-GROUP FREQUENCY COUNTER #2 |
| F7 | DATA 0 | HIGH-GROUP FREQUENCY COUNTER #3 |
| F8 | DATA 0 | HIGH-GROUP FREQUENCY COUNTER #4 |
| * | | |
| TESTL | DATA 0 | TEST REGISTER (STORE LOW FREQUENCY) |
| TESTH | DATA 0 | TEST REGISTER (STORE HIGH FREQUENCY) |
| * | | |
| * | ENERGY FRAMES AND THRESHOLDS | |
| * | | |
| ELY1 | DATA 0 | LOW-GROUP ENERGY FRAME #1 |
| ELY2 | DATA 0 | LOW-GROUP ENERGY FRAME #2 |
| ELY3 | DATA 0 | LOW-GROUP ENERGY FRAME #3 |
| ELY4 | DATA 0 | LOW-GROUP ENERGY FRAME #4 |
| * | | |
| EHY1 | DATA 0 | HIGH-GROUP ENERGY FRAME #1 |
| EHY2 | DATA 0 | HIGH-GROUP ENERGY FRAME #2 |
| EHY3 | DATA 0 | HIGH-GROUP ENERGY FRAME #3 |
| EHY4 | DATA 0 | HIGH-GROUP ENERGY FRAME #4 |
| * | | |
| LENRGY | DATA 0 | LOW-GROUP NOISE ENERGY THRESHOLD |
| HENRGY | DATA 0 | HIGH-GROUP NOISE ENERGY THRESHOLD |
| * | | |
| PORT | DATA 0 | I/O PORT |
| MASK | DATA 0 | DIGIT BLANKING MASK |
| SEVEN | DATA 0 | ARITHMETIC CONSTANT 7 |
| SIX | DATA 0 | ARITHMETIC CONSTANT 6 |
| FIVE | DATA 0 | ARITHMETIC CONSTANT 5 |
| FOUR | DATA 0 | ARITHMETIC CONSTANT 4 |
| THREE | DATA 0 | ARITHMETIC CONSTANT 3 |
| TWO | DATA 0 | ARITHMETIC CONSTANT 2 |

```
*
*           TEMPORARY REGISTERS
*
TMPFLG      DATA 0          TEMPORARY FLAG (LARGE TWIST)
TEMP        DATA 0          TEMPORARY REGISTER
TEMP1       DATA 0          TEMPORARY REGISTER
*
            AORG 0
*
***************************************************************
*           SYSTEM RESET VECTOR                                *
***************************************************************
*
            B START
*
***************************************************************
*           SYSTEM INITIALIZATION TABLE                        *
***************************************************************
*
TABLE       DATA 1          NUMERICAL CONSTANT 1
            DATA 0          SET ADDRESS LOGTBL TO 0
            DATA 0          RESET PAUSE FLAG TO 0
            DATA 0          RESET STOP FLAG TO 0
            DATA 0          RESET GAP FLAG TO 0
            DATA >4A00      8TH-ORDER ADAPTIVE THRESHOLD MULTIPLIER
            DATA >4600      LOW-GROUP ADAPTIVE THRESHOLD MULTIPLIER
            DATA >4600      HIGH-GROUP ADAPTIVE THRESHOLD MULTIPLIER
            DATA 8          SET SIGNAL/LINE IDLE/DROPOUT DETECT
*                           VALUE
            DATA >400       MINIMUM SIGNAL LEVEL; SET TO -25 DB
            DATA 0          RESET SIGNAL COUNTER TO 0
            DATA +120       SAMPLE COUNT FOR 30 MS OF DTMF TONES
            DATA 0          ZERO SYSTEM COUNTER VALUE
            DATA 0          ZERO SYSTEM COUNTER VALUE
            DATA 0          ZERO SYSTEM COUNTER VALUE
*
            DATA >7FFF      SET THRESHOLD FOR BANDPASS FILTERS
            DATA >7FFF      SET THRESHOLD FOR HIGH-GROUP DTMF BINS
            DATA >7FFF      SET THRESHOLD FOR LOW-GROUP DTMF BINS
            DATA 0          SET LOW-GROUP ADAPTIVE THRESHOLD VALUE
            DATA 0          SET HIGH-GROUP ADAPTIVE THRESHOLD VALUE
            DATA +60        SET THRESHOLD COUNT FOR DTMF BINS
            DATA 0          SET MAXIMUM OVERSPILL COUNT FOR
*                           LOW-GROUP
            DATA 0          SET MAXIMUM OVERSPILL COUNT FOR
*                           HIGH-GROUP
*
            DATA 0          ZERO SCALED INPUT X
*
            DATA >330       LOW-GROUP BANDPASS FILTER INPUT SCALER
            DATA >4A00      LOW-GROUP #1 FREQUENCY BIN OUTPUT SCALER
            DATA >5400      LOW-GROUP #2 FREQUENCY BIN OUTPUT SCALER
            DATA >5B00      LOW-GROUP #3 FREQUENCY BIN OUTPUT SCALER
            DATA >6000      LOW-GROUP #4 FREQUENCY BIN OUTPUT SCALER
*
*           DATA +14826     LOW-GROUP BANDPASS FILTER COEFFICIENT #1
            DATA +14890     LOW-GROUP BANDPASS FILTER COEFFICIENT #1
            DATA -31955     LOW-GROUP BANDPASS FILTER COEFFICIENT #2
*           DATA +11420     LOW-GROUP BANDPASS FILTER COEFFICIENT #3
```

```
       DATA +11360    LOW-GROUP BANDPASS FILTER COEFFICIENT #3
       DATA -31854    LOW-GROUP BANDPASS FILTER COEFFICIENT #4
*      DATA +7432     LOW-GROUP BANDPASS FILTER COEFFICIENT #5
       DATA +7500     LOW-GROUP BANDPASS FILTER COEFFICIENT #5
       DATA -31755    LOW-GROUP BANDPASS FILTER COEFFICIENT #6
*      DATA +2981     LOW-GROUP BANDPASS FILTER COEFFICIENT #7
       DATA +2950     LOW-GROUP BANDPASS FILTER COEFFICIENT #7
       DATA -31655    LOW-GROUP BANDPASS FILTER COEFFICIENT #8
*
       DATA 0         ZERO LOW-GROUP BANDPASS FILTER OUTPUT
       DATA 0         ZERO LOW-GROUP #1 FREQUENCY BIN OUTPUT
       DATA 0         ZERO LOW-GROUP #2 FREQUENCY BIN OUTPUT
       DATA 0         ZERO LOW-GROUP #3 FREQUENCY BIN OUTPUT
       DATA 0         ZERO LOW-GROUP #4 FREQUENCY BIN OUTPUT
*
       DATA 0         ZERO LOW-GROUP FILTER DELAY #1
       DATA 0         ZERO LOW-GROUP FILTER DELAY #2
       DATA 0         ZERO LOW-GROUP FILTER DELAY #3
       DATA 0         ZERO LOW-GROUP FILTER DELAY #4
       DATA 0         ZERO LOW-GROUP FILTER DELAY #5
       DATA 0         ZERO LOW-GROUP FILTER DELAY #6
       DATA 0         ZERO LOW-GROUP FILTER DELAY #7
       DATA 0         ZERO LOW-GROUP FILTER DELAY #8
*
       DATA >400      HIGH-GROUP BANDPASS FILTER INPUT SCALER
       DATA >5000     HIGH-GROUP #1 FREQUENCY BIN OUTPUT
                      SCALER
       DATA >5F00     HIGH-GROUP #2 FREQUENCY BIN OUTPUT
                      SCALER
       DATA >7000     HIGH-GROUP #3 FREQUENCY BIN OUTPUT
                      SCALER
       DATA >7700     HIGH-GROUP #4 FREQUENCY BIN OUTPUT
                      SCALER
*
*      DATA -10368    HIGH-GROUP BANDPASS FILTER COEFFICIENT
*                     #1
       DATA -10280    HIGH-GROUP BANDPASS FILTER COEFFICIENT
*                     #1
       DATA -31556    HIGH-GROUP BANDPASS FILTER COEFFICIENT
*                     #2
*      DATA -16144    HIGH-GROUP BANDPASS FILTER COEFFICIENT
*                     #3
       DATA -16180    HIGH-GROUP BANDPASS FILTER COEFFICIENT
*                     #3
       DATA -31358    HIGH-GROUP BANDPASS FILTER COEFFICIENT
*                     #4
*      DATA -21764    HIGH-GROUP BANDPASS FILTER COEFFICIENT
*                     #5
       DATA -21740    HIGH-GROUP BANDPASS FILTER COEFFICIENT
*                     #5
       DATA -31162    HIGH-GROUP BANDPASS FILTER COEFFICIENT
*                     #6
*      DATA -26706    HIGH-GROUP BANDPASS FILTER COEFFICIENT
*                     #7
       DATA -26700    HIGH-GROUP BANDPASS FILTER COEFFICIENT
*                     #7
       DATA -30966    HIGH-GROUP BANDPASS FILTER COEFFICIENT
                      #8
*
```

```
        DATA 0      ZERO HIGH-GROUP BANDPASS FILTER OUTPUT
        DATA 0      ZERO HIGH-GROUP #1 FREQUENCY BIN OUTPUT
        DATA 0      ZERO HIGH-GROUP #2 FREQUENCY BIN OUTPUT
        DATA 0      ZERO HIGH-GROUP #3 FREQUENCY BIN OUTPUT
        DATA 0      ZERO HIGH-GROUP #4 FREQUENCY BIN OUTPUT
*
        DATA 0      ZERO HIGH-GROUP FILTER DELAY #1
        DATA 0      ZERO HIGH-GROUP FILTER DELAY #2
        DATA 0      ZERO HIGH-GROUP FILTER DELAY #3
        DATA 0      ZERO HIGH-GROUP FILTER DELAY #4
        DATA 0      ZERO HIGH-GROUP FILTER DELAY #5
        DATA 0      ZERO HIGH-GROUP FILTER DELAY #6
        DATA 0      ZERO HIGH-GROUP FILTER DELAY #7
        DATA 0      ZERO HIGH-GROUP FILTER DELAY #8
*
        DATA 0      ZERO LOW-GROUP FREQUENCY COUNTER #1
        DATA 0      ZERO LOW-GROUP FREQUENCY COUNTER #2
        DATA 0      ZERO LOW-GROUP FREQUENCY COUNTER #3
        DATA 0      ZERO LOW-GROUP FREQUENCY COUNTER #4
        DATA 0      ZERO HIGH-GROUP FREQUENCY COUNTER #1
        DATA 0      ZERO HIGH-GROUP FREQUENCY COUNTER #2
        DATA 0      ZERO HIGH-GROUP FREQUENCY COUNTER #3
        DATA 0      ZERO HIGH-GROUP FREQUENCY COUNTER #4
*
        DATA 0      ZERO LOW-GROUP TEST COUNTER
        DATA 0      ZERO HIGH-GROUP TEST COUNTER
*
        DATA 0      ZERO LOW-GROUP ENERGY FRAME #1
        DATA 0      ZERO LOW-GROUP ENERGY FRAME #2
        DATA 0      ZERO LOW-GROUP ENERGY FRAME #3
        DATA 0      ZERO LOW-GROUP ENERGY FRAME #4
*
        DATA 0      ZERO HIGH-GROUP ENERGY FRAME #1
        DATA 0      ZERO HIGH-GROUP ENERGY FRAME #2
        DATA 0      ZERO HIGH-GROUP ENERGY FRAME #3
        DATA 0      ZERO HIGH-GROUP ENERGY FRAME #4
*
        DATA 0      ZERO LOW-GROUP NOISE ENERGY THRESHOLD
        DATA 0      ZERO HIGH-GROUP NOISE ENERGY THRESHOLD
*
        DATA 8      SET PORT NUMBER TO 8
        DATA >FF    SET MASK TO >FF
        DATA 7      SET SEVEN TO 7
        DATA 6      SET SIX TO 6
        DATA 5      SET FIVE TO 5
        DATA 4      SET FOUR TO 4
        DATA 3      SET THREE TO 3
        DATA 2      SET TWO TO 2
*
        DATA 0      RESET TEMPORARY FLAG TO 0
        DATA 0      ZERO TEMPORARY REGISTER
        DATA 0      ZERO TEMPORARY REGISTER
*
*****************************************************************
*       DTMF DIGIT DECODE TABLE                                  *
*****************************************************************
*
NUMBER  DATA 1      1   1   1   1
        DATA 2      2   3   4   6
```

```
              DATA  3                   0    3    7    3
              DATA  >A                  9    6    7    3
              DATA  4
              DATA  5         697       1    2    3    A
              DATA  6
              DATA  >B        770       4    5    6    B
              DATA  7
              DATA  8         852       7    8    9    C
              DATA  9
              DATA  >C        941       E    0    F    D
              DATA  >E
              DATA  0
              DATA  >F                DTMF KEY DECODE
              DATA  >D
*
***************************************************************
*          INITIALIZE SYSTEM DATA RAM AND CONSTANTS            *
***************************************************************
*
START         DINT                DISABLE ALL ILLEGAL INTERRUPTS
              LDPK  0             USE DATA PAGE 0
              LACK  TABLE         LOAD POINTER TO SYSTEM PARAMETER TABLE
              LARK  AR0,TEMP1     LOAD BOTTOM POINTER OF PARM. RAM TABLE
              LARK  AR1,ONE       LOAND TOP POINTER OF PARM. RAM TABLE
INITC         LARP  AR1           POINT AT TOP OF PARM. RAM TABLE
              TBLR  *+            INITIALIZE SYSTEM PARAMETERS
              ADD   ONE           INCREMENT TABLE POINTER
              LARP  AR0           CHOOSE BOTTOM POINTER
              BANZ  INITC         TEST IF INITIALIZATION DONE
              LT    ONE           FETCH CODEC CONVERSION TABLE ADDRESS
              MPYK  CODADD        PUT IT IN THE P-REGISTER
              PAC                 PUT IT IN THE ACCUMULATOR
              SACL  LOGTBL        STORE IT IN LOCATION LOGTBL
*
***************************************************************
*          INITIALIZE SYSTEM HEX DIGIT DISPLAYS                *
***************************************************************
*
              LAC   MASK,8
              SACL  TEMP
              OUT   TEMP,0        CLEAR DISPLAY
*
***************************************************************
*          INITIALIZE DTMF FLAGS AND COUNTERS                  *
***************************************************************
*
DTMF          ZAC
              SACL  SIGCNT        RESET FLAGS AND COUNTERS
              SACL  STOP
              SACL  GAP
              SACL  PAUSE
              SACL  F1            RESET FREQUENCY BIN OUTPUTS
              SACL  F2
              SACL  F3
              SACL  F4
              SACL  F5
              SACL  F6
              SACL  F7
              SACL  F8
```

```
           SACL CNTR      RESET TEMPORARY COUNTERS
           SACL CNTR1
           SACL CNTR2
*
***********************************************************************
*          INITIALIZE ADAPTIVE ENERGY FRAMES                           *
***********************************************************************
*
           SACL ELY1      RESET ENERGY FRAMES
           SACL ELY2
           SACL ELY3
           SACL ELY4
           SACL EHY1
           SACL EHY2
           SACL EHY3
           SACL EHY4
           SACL LENRGY    RESET FRAME ENERGY REGISTERS
           SACL HENRGY
*
***********************************************************************
*          INITIALIZE ADAPTIVE THRESHOLDS                              *
***********************************************************************
*
           SACL ADJL      RESET DATA ADAPTIVE THRESHOLDS
           SACL ADJH
*
***********************************************************************
*          CODEC INPUT BIO WAIT LOOP                                   *
***********************************************************************
*
SYNC       BIOZ SYNC1     WAIT FOR INPUT SAMPLE
           B    SYNC
SYNC1      IN   X,0       PERFORM 4 KHZ SUB-SAMPLING
SYNC2      BIOZ INPUT     AND ALIAS INPUT SPECTRUM
           B    SYNC2
INPUT      CALL CODEC     CALL PCM-TO-LINEAR ROUTINE
*
***********************************************************************
*          DTMF TONE DETECTION AND ASSOCIATED PROCESSING               *
***********************************************************************
*
DETECT     CALL HILOW     CALL HIGH-GROUP AND LOW-GROUP FILTERS
*
           ZALS PAUSE     CHECKING INTER-DIGIT PAUSE?
           BNZ  GAP1
*
           ZALS GAP       HAS 40 MS DTMF TRANSMISSION ELAPSED?
           BNZ  T8
*
*          TRACK INPUT SIGNAL ENERGY FOR HIGH AND LOW GROUPS
*
EFRM1      LAC  LY,11     SAVE LOW-GROUP ENERGY INFORMATION
           ABS
           ADDH LENRGY
           SACH LENRGY
EFRM2      LAC  HY,11     SAVE HIGH-GROUP ENERGY INFORMATION
           ABS
           ADDH HENRGY
           SACH HENRGY
```

```
*
*           TRACK INPUT SIGNAL SWING/PEAK INFORMATION PROCESSING
*
            LAC   LY         SAVE LOW-GROUP PEAK INFORMATION
            ABS
            SACL  TEMP
            SUB   ADJL
            BLEZ  PK
            LAC   TEMP
            SACL  ADJL
PK          LAC   HY         SAVE HIGH-GROUP PEAK INFORMATION
            ABS
            SACL  TEMP
            SUB   ADJH
            BLEZ  PK1
            LAC   TEMP
            SACL  ADJH
PK1         ZALS  CNTR1
            ADD   ONE
            SACL  CNTR1
            SUB   MINCNT     SAVE PEAKS OVER MINCNT SAMPLES
            BLZ   T8
            ZAC
            SACL  CNTR1
*
*           FRAME ENERGY PROCESSING FOR FIRST 40MS DURATION
*
            ZALS  CNTR2
            ADD   ONE
            SACL  CNTR2
FRM1        LACK  5          DECREMENT COUNTS FOR FIRST FRAME
            SUB   CNTR2      (10MS, 5 PERIODS OF 8 SAMPLES EACH)
            BNZ   FRM2
            LACK  1
            SACL  STOP
            LAC   LENRGY
            SACL  ELY1
            LAC   HENRGY
            SACL  EHY1
            B     ZEROE
FRM2        LACK  10         DECREMENT COUNTS FOR SECOND FRAME
            SUB   CNTR2      (10MS, 5 PERIODS OF 8 SAMPLES EACH)
            BNZ   FRM3
            LAC   LENRGY
            SACL  ELY2
            LAC   HENRGY
            SACL  EHY2
            B     ZEROE
FRM3        LACK  15         DECREMENT COUNTS FOR THIRD FRAME
            SUB   CNTR2      (10MS, 5 PERIODS OF 8 SAMPLES EACH)
            BNZ   FRM4
            LAC   LENRGY
            SACL  ELY3
            LAC   HENRGY
            SACL  EHY3
            B     ZEROE
FRM4        LACK  20         DECREMENT COUNTS FOR FOURTH FRAME
            SUB   CNTR2      (10MS, 5 PERIODS OF 8 SAMPLES EACH)
            BNZ   TSTW
```

```
              LAC   LENRGY
              SACL  ELY4
              LAC   HENRGY
              SACL  EHY4
ZEROE         ZAC
              SACL  LENRGY
              SACL  HENRGY
*
*       TWIST TEST (+4.0 DB TO -8.0 DB)
*
TSTW          LAC   ADJL         TEST FOR TWIST BEFORE
              SUB   ADJH         CALCULATING NEW THRESHOLDS
              BGEZ  TSTW1        IS LOW PEAK >= HIGH PEAK
              LAC   ADJL
              SACL  TEMP         SAVE SMALLER VALUE FOR ADAPT. THRESHOLD
              LT    ADJH         20 LOG (H/Y) = +4DB --> H*0.631 = L
              MPYK  >900
              PAC
              SUB   ADJL,12
              BGEZ  DTMF
              B     ADJST
TSTW1         LAC   ADJH
              SACL  TEMP         SAVE SMALLER VALUE FOR ADAPT. THRESHOLD
              LT    ADJL         20 LOG(H/Y) = -4DB --> L*0.631 = H
              MPYK  >680
              PAC
              SUB   ADJH,12
              BGEZ  TSTW2
              LACK  >46
              SACL  TEMP1
              LAC   TEMP1,8
              SACL  THRADH
              ZAC
              SACL  TMPFLG
              B     ADJST
TSTW2         LACK  >60
              SACL  TEMP1
              LAC   TEMP1,8
              SACL  THRADH
              LACK  1
              SACL  TMPFLG
              MPYK  >4E0
              PAC
              SUB   ADJH,12
              BGEZ  DTMF
*
*       TEST FOR MINIMUM INPUT SIGNAL LEVEL (APPROX: -25 DB)
*
ADJST         LAC   ADJH         TEST FOR MINIMUM SIGNAL
              SUB   MINTHR
              BLEZ  DTMF
              LAC   ADJL
              SUB   MINTHR
              BLEZ  DTMF
*
*       CALCULATE DATA-ADAPTIVE THRESHOLDS FOR TONES
*
CALTHR        LT    TEMP         CALCULATE NEW THRESHOLD FOR
              MPY   THRADJ       HIGH-GROUP AND LOW-GROUP
```

```
            PAC              EIGHT-ORDER BANDSPLIT FILTERS
            SACH THRSH8
            LT   ADJH        CALCULATE NEW THRESHOLD FOR
            MPY  THRADH      HIGH-GROUP FREQUENCY BINS
            PAC
            SACH THRHI
            LT   ADJL        CALCULATE NEW THRESHOLD FOR
            MPY  THRADL      LOW-GROUP FREQUENCY BINS
            PAC
            SACH THRLO
*
*           CHECK FOR TONE PRESENCE IN LOW-GROUP
*
T8          LAC  LY          GET LOW RESULT
            ABS              MAKE POSITIVE
            SUB  THRSH8      APPLY THRESHOLD
            BLEZ THR
*
*           CHECK FOR TONE PRESENCE IN HIGH-GROUP
*
            LAC  HY          GET HIGH RESULT
            ABS              MAKE POSITIVE
            SUB  THRSH8      APPLY THRESHOLD
            BLEZ THR
*
            ZAC
            SACL CNTR        ZERO TEMP CNTR AND GO TO
            B    SECOND      THRESHOLD FREQUENCY BINS
*
*           CHECK FOR END OF DTMF TRANSMISSION
*
THR         ZALS CNTR        CHECK IF INPUT SIGNAL IS GONE FOR
            ADD  ONE         MINCNT CONSECUTIVE INPUT SAMPLES
            SACL CNTR
            SUB  MINCNT
            BLZ  TCNT
*
            ZALS GAP         HAS 40MS DTMF TRANSMISSION ELAPSED?
            BZ   DTMF        IF YES, TRACK FOR INTER-DIGIT PAUSE
*
*           CHECK FOR VALID INTER-DIGIT PAUSE
*
GAPCHK      LACK 1
            SACL PAUSE
            LACK >88
            SACL SIGCNT
GAP1        ZALS SIGCNT
            SUB  ONE
            SACL SIGCNT
            BGZ  SYNC
            LACK >10         BLANK DISPLAY
            SACL >7F         NOTE: DATA RAM LOCATION >7F IS USED
*           OUT  >7F,3       OUTPUT BLANKING SIGNAL TO PORT 3
*
HOME        B    DTMF        RESET SYSTEM
*
*           THRESHOLD DTMF FREQUENCY BIN OUTPUTS
*
SECOND      ZALS GAP
```

```
         BNZ  SYNC
         ZALS STOP
         BZ   TCNT
THR0     LAC  LY1           THRESHOLD LOW-GROUP FREQUENCY BIN #1
         ABS
         SUB  THRLO
         BLEZ THR1
         ZALS F1            UPDATE LOW-GROUP FREQUENCY COUNTER #1
         ADD  ONE
         SACL F1
THR1     LAC  LY2           THRESHOLD LOW-GROUP FREQUENCY BIN #2
         ABS
         SUB  THRLO
         BLEZ THR2
         ZALS F2            UPDATE LOW-GROUP FREQUENCY COUNTER #2
         ADD ONE
         SACL F2
THR2     LAC  LY3           THRESHOLD LOW-GROUP FREQUENCY BIN #3
         ABS
         SUB  THRLO
         BLEZ THR3
         ZALS F3            UPDATE LOW-GROUP FREQUENCY COUNTER #3
         ADD  ONE
         SACL F3
THR3     LAC  LY4           THRESHOLD LOW-GROUP FREQUENCY BIN #4
         ABS
         SUB  THRLO
         BLEZ THR4
         ZALS F4            UPDATE LOW-GROUP FREQUENCY COUNTER #4
         ADD  ONE
         SACL F4
THR4     LAC  HY1           THRESHOLD HIGH-GROUP FREQUENCY BIN #1
         ABS
         SUB  THRHI
         BLEZ THR5
         ZALS F5            UPDATE HIGH-GROUP FREQUENCY COUNTER #1
         ADD ONE
         SACL F5
THR5     LAC  HY2           THRESHOLD HIGH-GROUP FREQUENCY BIN #2
         ABS
         SUB  THRHI
         BLEZ THR6
         ZALS F6            UPDATE HIGH-GROUP FREQUENCY COUNTER #2
         ADD  ONE
         SACL F6
THR6     LAC  HY3           THRESHOLD HIGH-GROUP FREQUENCY BIN #3
         ABS
         SUB  THRHI
         BLEZ THR7
         ZALS F7            UPDATE HIGH-GROUP FREQUENCY COUNTER #3
         ADD  ONE
         SACL F7
THR7     LAC  HY4           THRESHOLD HIGH-GROUP FREQUENCY BIN #4
         ABS
         SUB  THRHI
         BLEZ TCNT
         ZALS F8            UPDATE HIGH-GROUP FREQUENCY COUNTER #4
         ADD ONE
         SACL F8
```

```
*
TCNT        ZALS GAP         CHECK TOTAL SAMPLE COUNT
            BNZ  SYNC
            ZALS STOP        CHECK TOTAL SAMPLE COUNT
            BZ   SYNC
            ZALS SIGCNT      INCREMENT COUNT
            ADD  ONE
            SACL SIGCNT
*
            SUB  SCNT        TEST FOR 40MS TIME UP
            BLEZ SYNC
*
*****************************************************************
*           DTMF DIGIT DECODER                                   *
*****************************************************************
*           LOW-GROUP TONE DECODE
*
DECODE      EQU  $
*
*           ADAPTIVE PROFILE CHECK FOR 697 HZ BIN
*
FI0         LARP 0
            LARK 0,0
            LARK 1,0
            ZALS F1          DECODE LOW-GROUP FREQUENCY BIN #1
            SACL TESTL
            SUB  THRHL
            BLEZ FI1         TONE ABSENT, TRY NEXT BIN
EPCHK0      LT   ELY1        FIRST PROFILE CHECK
*           MPYK 3891        0.95*4096 (DEMO VERSION)
            MPYK 4095        0.999*4096
            PAC
            SUB  ELY2,12
            BGEZ NOFIND      REJECT IF PATTERN FAILS
            LT   ELY2        SECOND PROFILE CHECK
*           MPYK 3686        0.90*4096 (DEMO VERSION)
            MPYK 4095        0.999*4096
            PAC
            SUB  ELY3,12
            BGEZ NOFIND      REJECT IF PATTERN FAILS
EXIT0       SAR  1,F1        TONE PRESENT, ZERO COUNT FOR NOISE CHECK
            SAR  1,CNTR1     ZERO TONE PURITY COUNT FOR NOISE CHECK
            B    FIND1
*
*           ADAPTIVE PROFILE CHECK FOR 770 HZ BIN
*
FI1         MAR  *+
            ZALS F2          DECODE LOW-GROUP FREQUENCY BIN #2
            SACL TESTL
            SUB  THRHL
            BLEZ FI2         TONE ABSENT, TRY NEXT BIN
EPCHK1      LT   ELY1        FIRST PROFILE CHECK
*           MPYK 3891        0.95*4096 (DEMO VERSION)
            MPYK 4095        0.999*4096
            PAC
            SUB  ELY2,12
            BGEZ NOFIND      REJECT IF PATTERN FAILS
            LT   ELY2        SECOND PROFILE CHECK
*           MPYK 3686        0.90*40.96 (DEMO VERSION)
```

```
                MPYK 4094         0.999*4096
                PAC
                SUB  ELY3,12
                BGEZ NOFIND       REJECT IF PATTERN FAILS
EXIT1           SAR  1,F2         TONE PRESENT, ZERO COUNT FOR NOISE CHECK
                SAR  1,CNTR1      ZERO TONE PURITY COUNT FOR NOICE CHECK
                B    FIND1
*
*               ADAPTIVE PROFILE CHECK FOR 852 HZ BIND
*
FI2             MAR  *+
                ZALS F3           DECODE LOW-GROUP FREQUENCY BIN #3
                SACL TESTL
                SUB  THRHL
                BLEZ FI3          TONE ABSENT, TRY NEXT BIN
EPCHK2          LT   ELY1         FIRST PROFILE CHECK
*               MPYK 3891         0.95*4096 (DEMO VERSION)
                MPYK 4095         0.999*4096
                PAC
                SUB  ELY2,12
                BGEZ NOFIND       REJECT IF PATTERN FAILS
                LT   ELY2         SECOND PROFILE CHECK
*               MPYK 3686         0.90*4096 (DEMO VERSION)
                MPYK 3840         0.937*4096
                PAC
                SUB  ELY3,12
                BGEZ NOFIND       REJECT IF PATTERN FAILS
EXIT2           SAR  1,F3         TONE PRESENT, ZERO COUNT FOR NOISE CHECK
                SAR  1,CNTR1      ZERO TONE PURITY COUNT FOR NOISE CHECK
                B    FIND1
*
*               ADAPTIVE PROFILE CHECK FOR 941 HZ BIN
*
FI3             MAR  *+
                ZALS F4           DECODE LOW-GROUP FREQUENCY BIN #4
                SACL TESTL
                SUB  THRHL
                BLEZ NOFIND       TONE ABSENT, ABORT DTMF DECODE
EPCHK3          LT   ELY1         FIRST PROFILE CHECK
*               MPYK 3891         0.95*4096 (DEMO VERSION)
                MPYK 4048         0.988*4096
                PAC
                SUB  ELY2,12
                BGEZ NOFIND       REJECT IF PATTERN FAILS
                LT   ELY2         SECOND PROFILE CHECK
*               MPYK 3686         0.90*4096 (DEMO VERSION)
                MPYK 3712         0.906*4096
                PAC
                SUB  ELY3,12
                BGEZ NOFIND       REJECT IF PATTERN FAILS
EXIT3           SAR  1,F4         TONE PRESENT, ZERO COUNT FOR NOISE CHECK
                SAR  1,CNTR1      ZERO TONE PURITY COUNT FOR NOISE CHECK
*
*               CALCULATE ADAPTIVE NOISE FLOOR/ENERGY FOR LOW-GROUP
*
FIND1           LACK 63           CHECK IF TONE COUNT < 63
                SUB  TESTL
                BLEZ CAL11
```

```
                LACK  2             SET MAX. NOISE FLOOR AND ENERGY TO 2
                SACL  LOLIM
                SACL  LENRGY
                B     FIND11
CAL11           LACK  65            CHECK IF TONE COUNT < 65
                SUB   TESTL
                BLEZ  CAL12
                LACK  3             SET MAX. NOISE FLOOR VALUE TO 3
                SACK  LOLIM
                ADD   ONE,0         SET MAX. NOISE ENERGY TO 4
                SACL  LENRGY
                B     FIND11
CAL12           LACK  68            CHECK IF TONE COUNT < 68
                SUB   TESTL
                BLEZ  CAL13
                LACK  5             SET MAX. NOISE FLOOR VALUE TO 5
                SACL  LOLIM
                ADD   ONE,1         SET MAX. NOISE ENERGY TO 7
                SACL  LENERGY
                B     FIND11
CAL13           LACK  73            CHECK IF TONE COUNT < 73
                SUB   TESTL
                BLEZ  CAL14
                LACK  7             SET MAX. NOISE FLOOR VALUE TO 7
                SACL  LOLIM
                ADD   ONE,1         SET MAX. NOISE ENERGY TO 9
                SACL  LENRGY
                B     FIND11
CAL14           LACK  78            CHECK IF TONE COUNT <78
                SUB   TESTL
                BLEZ  CAL15
                LACK  9             SET MAX. NOISE FLOOR VALUE TO 9
                SACL  LOLIM
                ADD   ONE,2         SET MAX. NOISE ENERGY TO 13
                SACL  LENRGY
                B     FIND11
CAL15           LACK  14            SET MAX. NOISE FLOOR VALUE TO 14 FOR A
                SACL  LOLIM         TONE COUNT GREATER THAN OR EQUAL TO 78
                ADD   ONE,0         SET MAX. NOISE ENERGY TO 15
                SACL  LENRGY
*
*               CHECK FOR PRESENCE OF ONLY ONE TONE IN LOW-GROUP
*
FIND11          SAR   0,TEMP
                ZALS  F1
                SUB   LOLIM
                BGZ   NOFIND        REJECT IF SIGNAL > NOISE FLOOR
                ZALS  F2
                SUB   LOLIM
                BGZ   NOFIND        REJECT IF SIGNAL > NOISE FLOOR
                ZALS  F3
                SUB   LOLIM
                BGZ   NOFIND        REJECT IF SIGNAL > NOISE FLOOR
                ZALS  F4
                SUB   LOLIM
                BGZ   NOFIND        REJECT IF SIGNAL > NOISE FLOOR
*
*               TONE PURITY CHECK : ZERO COUNT FOR AT LEAST TWO BINS
*
```

```
TP0         ZALS F1             CHECK IF F1 BIN COUNT IS ZERO
            BNZ  TP1
            ZALS CNTR1          INCREMENT TONE PURITY COUNTER IF YES
            ADD  ONE
            SACL CNTR1
TP1         ZALS F2             CHECK IF F2 BIN COUNT IS ZERO
            BNZ  TP2
            ZALS CNTR1          INCREMENT TONE PURITY COUNTER IF YES
            ADD  ONE
            SACL CNTR1
TP2         ZALS F3             CHECK IF F3 BIN COUNT IS ZERO
            BNZ  TP3
            ZALS CNTR1          INCREMENT TONE PURITY COUNTER IF YES
            ADD  ONE
            SACL CNTR1
TP3         ZALS F4             CHECK IF F4 BIN COUNT IS ZERO
            BNZ  TPCHK1
            ZALS CNTR1          INCREMENT TONE PURITY COUNTER IF YES
            ADD  ONE
            SACL CNTR1
TPCHK1      LACK 3              CHECK IF AT LEAST 2 BINS HAVE 0 COUNT
            SUB  CNTR1
            BLEZ F14            IF NOT, CHECK NOISE ENERGY
*
*           LOW-GROUP ADAPTIVE NOISE ENERGY CHECK
*
NECHK1      ZALS F1             SUM ALL NOISE ENERGY
            ADDS F2
            ADDS F3
            ADDS F4
            SUBS LENRGY
            BGZ  NOFIND         REJECT IF TOO MUCH NOISE ENERGY
*
*           HIGH-GROUP TONE DECODE
*
NXTGRP      EQU  $
*
*           ADAPTIVE PROFILE CHECK FOR 1209 HZ BIN
*
FI4         LARK 0,0
            ZALS F5             DECODE HIGH-GROUP FREQUENCY BIN #1
            SACL TESTH
            SUB  THRHL
            BLEZ F15            TONE ABSENT, TRY NEXT BIND
EPCHK4      LT   EHY1           FIRST PROFILE CHECK
*           MPYK 3686           0.90*4096 (DEMO VERSION)
            MPYK 4095           0.999*4096
            PAC
            SUB  EHY2,12
            BGEZ NOFIND         REJECT IF PATTERN FAILS
            LAC  TMPFLG
            BNZ  EXIT4
            LT   EHY2           SECOND PROFILE CHECK
*           MPYK 3276           0.80*4096 (DEMO VERSION)
            MPYK 3276           0.800*4096
            PAC
            SUB  EHY3,12
            BGEZ NOFIND         REJECT IF PATTERN FAILS
EXIT4       SAR  1,F5           TONE PRESENT, ZERO COUNT FOR NOISE CHECK
```

```
           SAR   1,CNTR2    ZERO TONE PURITY COUNT FOR NOISE CHECK
           B     FIND2
*
*          ADAPTIVE PROFILE CHECK FOR 1336 HZ BIN
*
FI5        MAR   *+
           ZALS  F6         DECODE HIGH-GROUP FREQUENCY BIN #2
           SACL  TESTH
           SUB   THRHL
           BLEZ  FI6        TONE ABSENT, TRY NEXT BIN
EPCHK5     LT    EHY1       FIRST PROFILE CHECK
*          MPYK  3686       0.90*4096 (DEMO VERSION)
           MPYK  3350       0.844*4096
           PAC
           SUB   EHY2,12
           BGEZ  NOFIND     REJECT IF PATTERN FAILS
           LAC   TMPFLG
           BNZ   EXIT5
           LT    EHY2       SECOND PROFILE CHECK
*          MPYK  3276       0.80*4096 (DEMO VERSION)
           MPYK  3460       0.844*4096
           PAC
           SUB   EHY3,12
           BGEZ  NOFIND     REJECT IF PATTERN FAILS
EXIT5      SAR   1,F6       TONE PRESENT, ZERO COUNT FOR NOISE CHECK
           SAR   1,CNTR2    ZERO TONE PURITY COUNT FOR NOISE CHECK
           B     FIND2
*
*          ADAPTIVE PROFILE CHECK FOR 1477 HZ BIN
*
FI6        MAR   *+
           ZALS  F7         DECODE HIGH-GROUP FREQUENCY BIN #3
           SACL  TESTH
           SUB   THRHL
           BLEZ  FI7        TONE ABSENT, TRY NEXT BIN
EPCHK6     LT    EHY1       FIRST PROFILE CHECK
*          MPYK  3686       0.90*4096 (DEMO VERSION)
           MPYK  3840       0.937*4096
           PAC
           SUB   EHY2,12
           BGEZ  NOFIND     REJECT IF PATTERN FAILS
           LAC   TMPFLG
           BNZ   EXIT6
           LT    EHY2       SECOND PROFILE CHECK
*          MPYK  3276       0.80*4096 (DEMO VERSION)
           MPYK  3328       0.812*4096
           PAC
           SUB   EHY3,12
           BGEZ  NOFIND     REJECT IF PATTERN FAILS
EXIT6      SAR   1,F7       TONE PRESENT, ZERO COUNT FOR NOISE CHECK
           SAR   1,CNTR2    ZERO TONE PURITY COUNT FOR NOISE CHECK
           B     FIND2
*
*          ADAPTIVE PROFILE CHECK FOR 1633 HZ BIN
*
FI7        MAR   *+
           ZALS  F8         DECODE HIGH-GROUP FREQUENCY BIN #4
           SACL  TESTH
           SUB   THRHL
```

```
         BLEZ  NOFIND    TONE ABSENT, ABORT DTMF DECODE
EPCHK7   LT    EHY1      FIRST PROFILE CHECK
*        MPYK  3686      0.90*4096 (DEMO VERSION)
         MPYK  3840      0.937*4096
         PAC
         SUB   EHY2,12
         BGEZ  NOFIND    REJECT IF PATTERN FAILS
         LAC   TMPFLG
         BNZ   EXIT7
         LT    EHY2      SECOND PROFILE CHECK
*        MPYK  3276      0.80*4096 (DEMO VERSION)
         MPYK  3328      0.844*4096
         PAC
         SUB   EHY3,12
         BGEZ  NOFIND    REJECT IF PATTERN FAILS
EXIT7    SAR   1,F8      TONE PRESENT, ZERO COUNT FOR NOISE CHECK
         SAR   1,CNTR2   ZERO TONE PURITY COUNT FOR NOISE CHECK
*
*        CALCULATE ADAPTIVE NOISE FLOOR/ENERGY FOR HIGH-GROUP
*
FIND2    LACK  63        CHECK IF TONE COUNT < 63
         SUB   TESTH
         BLEZ  CAL21
         LACK  2         SET MAX. NOISE FLOOR AND ENERGY TO 2
         SACL  HILIM
         SACL  HENRGY
         B     FIND22
CAL21    LACK  65        CHECK IF TONE COUNT < 65
         SUB   TESTH
         BLEZ  CAL22
         LACK  2         SET MAX. NOISE FLOOR VALUE TO 2
         SACL  HILIM
         ADD   ONE,0     SET MAX. NOISE ENERGY TO 3
         SACL  HENRGY
         B     FIND22
CAL22    LACK  68        CHECK IF TONE COUNT < 68
         SUB   TESTH
         BLEZ  CAL23
         LACK  3         SET MAX. NOISE FLOOR VALUE TO 3
         SACL  HILIM
         ADD   ONE,1     SET MAX. NOISE ENERGY TO 5
         SACL  HENRGY
         B     FIND22
CAL23    LACK  73        CHECK IF TONE COUNT < 73
         SUB   TESTH
         BLEZ  CAL24
         LACK  5         SET MAX. NOISE FLOOR VALUE TO 5
         SACL  HILIM
         ADD   ONE,1     SET MAX. NOISE ENERGY TO 7
         SACL  HENRGY
         B     FIND22
CAL24    LACK  78        CHECK IF TONE COUNT < 78
         SUB   TESTH
         BLEZ  CAL25
         LACK  6         SET MAX. NOISE FLOOR VALUE TO 6
         SACL  HILIM
         ADD   ONE,1     SET MAX. NOISE ENERGY TO 8
         SACL  HENRGY
         B     FIND22
```

```
CAL25    LACK 15          SET MAX. NOISE FLOOR VALUE TO 15 FOR A
         SACL HILIM       TONE COUNT GREATER THAN OR EQUAL TO 78
         ADD  ONE,0       SET MAX. NOISE ENERGY TO 16
         SACL HENRGY
*
*        CHECK FOR PRESENCE OF ONLY ONE TONE IN HIGH-GROUP
*
FIND22   ZALS F5
         SUB  HILIM
         BGZ  NOFIND      REJECT IF SIGNAL > NOISE FLOOR
         ZALS F6
         SUB  HILIM
         BGZ  NOFIND      REJECT IF SIGNAL > NOISE FLOOR
         ZALS F7
         SUB  HILIM
         BGZ  NOFIND      REJECT IF SIGNAL > NOISE FLOOR
         ZALS F8
         SUB  HILIM
         BGZ  NOFIND      REJECT IF SIGNAL > NOISE FLOOR
*
*        TONE PURITY CHECK : ZERO COUNT FOR AT LEAST TWO BINS
*
TP4      ZALS F5          CHECK IF F5 BIN COUNT IS ZERO
         BNZ  TP5
         ZALS CNTR2       INCREMENT TONE PURITY COUNTER IF YES
         ADD  ONE
         SACL CNTR2
TP5      ZALS F6          CHECK IF F6 BIN COUNT IS ZERO
         BNZ  TP6
         ZALS CNTR2       INCREMENT TONE PURITY COUNTER IF YES
         ADD  ONE
         SACL CNTR2
TP6      ZALS F7          CHECK IF F7 BIN COUNT IS ZERO
         BNZ  TP7
         ZALS CNTR2       INCREMENT TONE PURITY COUNTER IF YES
         ADD  ONE
         SACL CNTR2
TP7      ZALS F8          CHECK IF F8 BIN COUNT IS ZERO
         BNZ  TPCHK2
         ZALS CNTR2       INCREMENT TONE PURITY COUNTER IS YES
         ADD  ONE
         SACL CNTR2
TPCHK2   LACK 3           CHECK IF AT LEAST 2 BINS HAVE 0 COUNT
         SUB  CNTR2
         BLEZ HDIGIT      IF NOT, CHECK NOISE ENERGY
*
*        HIGH-GROUP ADAPTIVE NOISE ENERGY CHECK
*
NECHK2   ZALS F5          SUM ALL NOISE ENERGY
         ADDS F6
         ADDS F7
         ADDS F8
         SUBS HENRGY
         BGZ  NOFIND      REJECT IF TOO MUCH ENERGY
*
***************************************************************
*        END OF DECODER ROUTINE                                *
***************************************************************
*
```

```
*           LOOKUP DECODED HEX DIGIT FROM HEX TABLE
*
HDIGIT      LACK NUMBER     CODE DUAL TONE IN HEX DIGIT.
            ADD  TEMP,2
            SAR  0,TEMP
            ADD  TEMP
            TBLR TEMP       VALID HEX DIGIT IS IN TEMP
*
*           DIGIT COUNTS
*
DCOUNT      SACL TEMP1
            LACK NUMBER
            SUB  TEMP1
            BZ   DIGIT1
            LACK NUMBER+3
            SUB  TEMP1
            BZ   NDIGIT
            LACK NUMBER+7
            SUB  TEMP1
            BZ   NDIGIT
            LACK NUMBER+11
            SUB  TEMP1
            BZ   NDIGIT
            LACK NUMBER+15
            SUB  TEMP1
            BZ   NDIGIT
            LACK NUMBER+12
            SUB  TEMP1
            BZ   STARLB
            LACK NUMBER+14
            SUB  TEMP1
            BZ   STARLB
            B    JBEDIT
DIGIT1      ZALS >7A
            ADD  ONE
            SACL >7A
            B    JBEDIT
NDIGIT      ZALS >7B
            ADD  ONE
            SACL >7B
            B    JBEDIT
STARLB      ZALS >7C
            ADD  ONE
            SACL >7C
*
****************************************************************
*           OUTPUT DECODED HEX DIGIT                            *
****************************************************************
*
JBEDIT      LAC  MASK,7     SHIFT MASK LEFT ONE SPACE TO UNBLANK
            SACL MASK       NEXT DIGIT
            LAC  MASK,8
            SACH MASK
            LAC  PORT       POINT TO NEXT DIGIT
            SUB  ONE
            SACL PORT
            BGEZ OK         IF PORT IS LESS THAN ZERO TIME TO RESET
            LACK 7          BLANKING. MASK AND DIGIT POINTER (PORT)
            SACL PORT
```

```
                LACK  >7F
                SACL  MASK
OK              LAC   MASK,8      OTHERWISE FORM OUTPUT WORD AND DISPLAY
*
*****************************************************************
*
*       +--------------------------------------------------------+
*                                                        DISPLAY
*       -BLANKING REGISTER-     X X X X      --DATA--
*       _  _  _  _  _  _  _  _  _ _ _ _   _  _ _
*       15 14 13 12 11 10 9  8  7 6 5 4   3  2 1 0
*
*                OUTPUT WORD (TEMP) FORMAT
*       +--------------------------------------------------------+
*
*****************************************************************
*
                ADD   TEMP
                SACL  TEMP1
                LAC   PORT        WRITE OUTPUT WORD TO DISPLAY CIRCUIT
                SUB   SEVEN
                BZ    SEVENJ
                LAC   PORT        WRIT OUTPUT WORD TO DISPLAY CIRCUIT
                SUB   SIX
                BZ    SIXJ
                LAC   PORT        WRITE OUTPUT WORD TO DISPLAY CIRCUIT
                SUB   FIVE
                BZ    FIVEJ
                LAC   PORT        WRITE OUTPUT WORD TO DISPLAY CIRCUIT
                SUB   FOUR
                BZ    FOURJ
                LAC   PORT        WRITE OUTPUT WORD TO DISPLAY CIRCUIT
                SUB   THREE
                BZ    THREEJ
                LAC   PORT        WRITE OUTPUT WORD TO DISPLAY CIRCUIT
                SUB   TWO
                BZ    TWOJ
                LAC   PORT        WRITE OUTPUT TO DISPLAY CIRCUIT
                SUB   ONE
                BZ    ONEJ
*
ZEROJ           OUT   TEMP1,0
                B     JBCON
ONEJ            OUT   TEMP1,1
                B     JBCON
TWOJ            OUT   TEMP1,2
                B     JBCON
THREEJ          OUT   TEMP1,3
                B     JBCON
FOURJ           OUT   TEMP1,4
                B     JBCON
FIVEJ           OUT   TEMP1,5
SIXJ            OUT   TEMP1,6
                B     JBCON
SEVENJ          OUT   TEMP1,7
*
*****************************************************************
*          END OF DIGIT OUTPUT ROUTINE                           *
*****************************************************************
```

```
*
*
*         UPDATE COUNTER FOR VALIDATED DIGITS
*
JBCON     ZALS >7E         UPDATE COUNTER OF VALID DECODES
          ADD  ONE
          SACL >7E         NOTE: DATA RAM LOCATION > 7E IS USED
*
SETGAP    LACK 1           VALID INTER-DIGIT PAUSE MUST
          SACL GAP         FOLLOW DTMF TONE - SET GAP FLAG
          B    SYNC
*
*         UPDATE COUNTER TO INDICATE NUMBER OF REJECTIONS
*
NOFIND    ZALS >7D         UPDATE COUNTER OF REJECTED DIGITS DUE
          ADD  ONE         TO DIGIT SIMULATIONS OR OTHERWISE
          SACL >7D         NOTE: DATA RAM LOCATION >7D IS USED
*
          B    SETGAP      CONTINUE
*
****************************************************************
*         LOW-GROUP/HIGH-GROUP BANDPASS FILTERS                 *
****************************************************************
*
HILOW     ZAC
          LT   TEMP        LOAN LINEAR PCM DATA
          MPY  LS          SCALE INPUT DATA
          LTA  LIN2        LOAD RESULT INTO THE ACCUMULATOR
          SACH X,1         STORE IN LOCATION X
*
*         DTMF LOW-GROUP BANDPASS FILTER
*
          LAC  X,15
          MPY  L1D
          LTD  L1N1
          MPY  L1C
          APAC
          SACH LY1,1
          LTA  LY1
          SACH L1N1,1
          MPY  LS1
          PAC
          LTA  L2N2
          SACH LY1,1
*
          LAC  X,15
          MPY  L2D
          LTD  L2N1
          MPY  L2C
          APAC
          SACH LY2,1
          LTA  LY2
          SACH L2N1,1
          MPY  LS2
          PAC
          LTA  L3N2
          SACH LY2,1
*
          LAC  X,15
```

```
      MPY  L3D
      LTD  L3N1
      MPY  L3C
      APAC
      SACH LY3,1
      LTA  LY3

SACH L3N1,1
      MPY  LS3
      PAC
      LTA  L4N2
      SACH LY3,1
*
      LAC  X,15
      MPY  L4D
      LTD  L4N1
      MPY  L4C
      APAC
      SACH LY4,1
      LTA  LY4
      SACH L4N1,1
      MPY  LS4
      PAC
      LTA  TEMP
      SACH LY4,1
*
      ZALH LY1            PROCESS LOW-GROUP FREQUENCY BINS
      SUBH LY2
      ADDH LY3
      SUBH LY4
      SACH LY,0           STORE LOW-GROUP BANDPASS FILTER OUTPUT
*
*
*     DTMF HIGH-GROUP BANDPASS FILTER
*
      ZAC
      MPY  HS             SCALE INPUT DATA.
      LTA  H1N2           LOAD RESULT INTO THE ACCUMULATOR.
      SACH X,1            STORE IN LOCATION X
*
      LAC  X,15
      MPY  H1D
      LTD  H1N1
      MPY  H1C
      APAC
      SACH HY1,1
      LTA  HY1
      SACH H1N1,1
      MPY  HS1
      PAC
      LTA  H2N2
      SACH HY1,1
*
      LAC  X,15
      MPY  H2D
      LTD  H2N1
      MPY  H2C
      APAC
      SACH HY2,1
```

```
        LTA   HY2
        SACH  H2N1,1
        MPY   HS2
        PAC
        LTA   H3N2
        SACH  HY2,1
*
        LAC   X,15
        MPY   H3D
        LTD   H3N1
        MPY   H3C
        APAC
        SACH  HY3,1
        LTA   HY3
        SACH  H3N1,1
        MPY   HS3
        PAC
        LTA   H4N2
        SACH  HY3,1
*
        LAC   X,15
        MPY   H4D
        LTD   H4N1
        MPY   H4C
        APAC
        SACH  HY4,1
        LTA   HY4
        SACH  H4N1,1
        MPY   HS4
        PAC
        APAC
        SACH  HY4,1
*
        ZALH  HY1         PROCESS HIGH-GROUP FREQUENCY BINS
        SUBH  HY2
        ADDH  HY3
        SUBH  HY4
        SACH  HY,0        STORE HIGH-GROUP BANDPASS FILTER OUTPUT
*
        RET
*
****************************************************************
*       CODEC INPUT ROUTINE                                     *
****************************************************************
*
CODEC   IN    X,3         READ IN CODEC DATA TO CLEAR BIO
        LACK  255         LOAD MASK >FF FOR BIT-INVERSION
        XOR   X           PERFORM ONE'S COMPLEMENT ON PCM DATA
        SACL  X,0         STORE LOG-PCM SAMPLE
*
****************************************************************
*       LOG 7-BIT PCM TO LINEAR 13-BIT 2'S COMPLEMENT           *
****************************************************************
*
        LACK  127
        AND   X           COMPUTE ADDRESS IN CONVERSION TABLE
        ADD   LOGTBL,0    ADD BASE ADDRESS OF TABLE
        TBLR  TEMP        GET TABLE VALUE
*
```

```
            LACK 128         CHECK SIGN OF LINEAR PCM VALUE
            AND  X
            BZ   CDRET       SIGN IS CORRECT
            ZAC
            SUB  TEMP        CHANGE SIGN IF NEGATIVE
            SACL TEMP
*
CDRET       RET              RETURN TO MAIN ROUTINE
*
****************************************************************
*           CODEC-TO-LINEAR CONVERSION TABLE                    *
****************************************************************
*
CODADD      DATA 0
            DATA 8
            DATA 16
            DATA 24
            DATA 32
            DATA 40
            DATA 48
            DATA 56
            DATA 64
            DATA 72
            DATA 80
            DATA 88
            DATA 96
            DATA 104
            DATA 112
            DATA 120
            DATA 132
            DATA 148
            DATA 164
            DATA 180
            DATA 196
            DATA 212
            DATA 228
            DATA 244
            DATA 260
            DATA 276
            DATA 292
            DATA 308
            DATA 324
            DATA 340
            DATA 356
            DATA 372
            DATA 396
            DATA 428
            DATA 460
            DATA 492
            DATA 524
            DATA 556
            DATA 588
            DATA 620
            DATA 652
            DATA 684
            DATA 716
            DATA 748
            DATA 780
            DATA 812
```

```
DATA 844
DATA 876
DATA 924
DATA 988
DATA 1052
DATA 1116
DATA 1180
DATA 1244
DATA 1308
DATA 1372
DATA 1436
DATA 1500
DATA 1564
DATA 1628
DATA 1692
DATA 1756
DATA 1820
DATA 1884
DATA 1980
DATA 2108
DATA 2236
DATA 2364
DATA 2492
DATA 2620
DATA 2748
DATA 2876
DATA 3004
DATA 3132
DATA 3260
DATA 3388
DATA 3516
DATA 3644
DATA 3772
DATA 3900
DATA 4092
DATA 4348
DATA 4604
DATA 4860
DATA 5116
DATA 5372
DATA 5628
DATA 5884
DATA 6140
DATA 6396
DATA 6652
DATA 6908
DATA 7164
DATA 7420
DATA 7676
DATA 7932
DATA 8316
DATA 8828
DATA 9340
DATA 9852
DATA 10364
DATA 10876
DATA 11388
DATA 11900
DATA 12412
```

```
DATA 12924
DATA 13436
DATA 13948
DATA 14460
DATA 14972
DATA 15484
DATA 15996
DATA 16764
DATA 17788
DATA 18812
DATA 19836
DATA 20860
DATA 21884
DATA 22908
DATA 23932
DATA 24956
DATA 25980
DATA 27004
DATA 28028
DATA 29052
DATA 30076
DATA 31100
DATA 32124
END
```

TESTS OF THE DTMF RECEIVER

The single-channel DTMF decoder of the invention performed well on all of the MITEL tests using the CM7291 MITEL tape. Most of the measured parameters are digitally controlled and may be modified to improve the decoder performance should it be required to operate in extreme conditions. A variation in each parameter is simply performed by modifying a software constant in the code. The results of the MITEL test tape are as follows:

MITEL TEST

| | |
|---|---|
| Immunity to 1 KHz tone | Checked |
| Valid decodes (16 digits) | 160 out of 160 |
| Center frequency offset | +/− 1.7% to 2.6% |
| Twist acceptance | +4 dB to −8 dB (minimum) |
| Dynamic range | 25 dB (programmable) |
| Decode or guard time | 30 milliseconds |
| Signal-to-noise performance: | |
| −24 dB: | 1000 out of 1000 |
| −18 dB: | 1000 out of 1000 |
| −12 dB: | 1000 out of 1000 |
| Talk-off test: | 3 hits |

The signal-to-noise performance test consisted of three sections where 1000 tone pairs were transmitted in the presence of Gaussian noise. The signal-to-noise ratio was gradually reduced from −24 dB to −12 dB. The receiver performed well at all tested levels, and may even be able to decode beyond the −12 dB signal-to-noise ratio.

The results of the standard AT&T digit simulation test are given below.

| Side | DIGITS | | | | |
|---|---|---|---|---|---|
| | 1 | A–D | *,# | 0–9 | 0–F |
| 1: | 22 | 9 | 1 | 55 | 64 |
| 2: | 26 | 1 | 0 | 48 | 49 |
| 3: | 32 | 6 | 1 | 71 | 78 |
| 4: | 25 | 6 | 2 | 51 | 59 |
| 5: | 15 | 10 | 2 | 38 | 50 |
| 6: | 31 | 9 | 0 | 52 | 61 |
| TOTAL: | 151 | 41 | 6 | 315 | 362 |

The invention has been described as embodied in a single-channel DTMF receiver for the recognition of telephone digits. The invention however, may also be used to convert from DTMF to pulse-dialing and vice versa, and to convert from DTMF to MF and vice versa. The invention may further be used in multi-line DTMF decoding.

Apart from telephone digit recognition, the receiver of the invention can be used in secured financial and computer transactions; credit checking via the public telephone network; remote data logging and remote terminals for data entry; automatic teller machines; remote home and plant control; and as an alternative to a MODEM and as a portion of an unauthorized call interceptor. The invention can further be used to validate legal accesses and intercept legal attempts as a security checker; as an activator for automatic answering services and transactions and for vocoding in store-and-forward systems.

The system is further useful in the design of multi-line MF encoding and decoding, multi-line DTMF tone encoding, and as a line monitor and test signal generator.

The invention can further be used in digital speech interpolation, speech recognition and speech compression, speech store-and-forward and voice mail, speech detection and call routing, voice dial/automatic call placement and teleconferencing.

In summary, a digital DTMF receiver has been described. The system incorporates a pair of eighth-order digital bandpass filters that in turn supply peak intensity information to frequency domain template generators and time domain template generators. These test templates are generated using data-adaptive thresholding. The templates are then tested to detect the occurrence of a valid dual tone pair.

While a preferred embodiment and its advantages has been described in the above detailed description, the invention is not limited thereto but only by the spirit and scope of the appended claims.

What is claimed is:

1. Apparatus for recognizing a pattern in an input signal, comprising:
   a digital filter for generating a temporal energy signal and a plurality of spectral energy signals for each of a plurality of predetermined sampling periods in response to receiving said input signal;
   a time-domain test template generator for receiving said temporal energy signal and operable to generate a time-domain test template in response thereto;
   a frequency-domain test template generator for receiving said spectral energy signals and operable to generate a frequency-domain test template in response thereto; and
   a pattern recognizer coupled to said test template generators for comparing at least one time-domain reference template to said time-domain test template and for comparing at least one frequency-domain reference template to said frequency-domain test template, said recognizer indicating recognition of a pattern upon a predetermined match of said templates.

2. Apparatus for recognizing each of a plurality of multi-frequency tones, each tone centered on a predetermined frequency, comprising:
   a digital bandpass filter having a plurality of frequency bins, each bin incorporating a transfer function for preferentially transmitting frequencies of an input signal near one of said predetermined frequencies, each frequency bin accumulating a spectral energy signal for each of a plurality of filter sampling periods and deriving a temporal energy signal as a function of said preferentially transmitted frequencies for each of said sampling periods;
   a time-domain test template generator coupled to said filter for receiving said temporal energy signal and generating a time-domain test template in response thereto;
   a frequency-domain test template generator coupled to said filter for receiving said spectral energy signals and generating a frequency-domain test template in response thereto; and
   an analyzer coupled to said template generators for comparing at least one frequency-domain test template to at least one frequency-domain reference template and for comparing said time-domain test template to at least one time-domain reference template, said analyzer indicating a predetermined multi-frequency tone upon a predetermined match of said templates.

3. The apparatus of claim 2, wherein at least one of said transfer functions is of the second-order type.

4. The apparatus of claim 3, wherein at least one of said transfer functions is of the form:

$$H(z) = \frac{1 - e^{-aT}\cos bT z^{-1}}{1 - 2e^{-aT}\cos bT z^{-1} + e^{-2aT} z^{-2}}$$

wherein a is half of the bandwidth of the respective frequency bin, b is a respective predetermined frequency, T is the length of each sampling period and $e^{-aT}$ is the pole radius of each complex pole pair.

5. The apparatus of claim 3, wherein at least one of said transfer functions is of the form:

$$H(z) = \frac{1 + (1 - 2e^{-aT}\cos bT)z^{-1}}{1 - (2e^{-aT}\cos bT - 1 + 1)z^{-1} + e^{-2aT} z^{-2}}$$

where a is half of the bandwidth of the respective frequency bin, b is a respective predetermined frequency, T is the length of each sampling period and $e^{-aT}$ is the pole radius of each complex pole pair.

6. The apparatus of claim 2, and further comprising a second digital bandpass filter having a plurality of second frequency bins each incorporating a transfer function for preferentially transmitting second frequencies of said input signal near one of a group of second predetermined frequencies, each second frequency bin accumulating for each of said sampling periods respective second spectral energy signals, said second filter deriving a second temporal energy signal as a function of said preferentially transmitted second frequencies;
   a second time-domain test template generator coupled to said second bandpass filter for generating a second time-domain test template in response to receiving said second temporal energy signal;
   a second frequency-domain test template generator coupled to said second bandpass filter for generating a second frequency-domain test template in response to said second spectral energy signals; and
   said analyzer coupled to said first and second template generators for recognizing a tone from said bandpass filter and a tone from said second bandpass filter.

7. The apparatus of claim 6, wherein said apparatus is adapted to recognize a dual-tone multi-frequency signal, said first bandpass filter having four frequency bins for preferentially transmitting frequencies near each of four standard low-group predetermined frequencies, said second bandpass filter having four frequency bins for preferentially transmitting each of four standard high-group predetermined frequencies, said analyzer operable to recognize a valid dual-tone pair of said predetermined frequencies.

8. The apparatus of claim 2, wherein said time-domain test template generator comprises an accumulator for accumulating said temporal energy signals for each of a plurality of time intervals, each interval comprising a plurality of said sampling periods.

9. The apparatus of claim 8, wherein said analyzer is operable to generate said time-domain reference template from said time-domain test template and a plurality of known reference ratios from a predetermined acceptable digital bandpass filter response, said ratios including a first ratio of the accumulated energy for one interval of said predetermined response to the accumulated energy for an immediately preceding interval of said predetermined response, and a second ratio of accumulated energy for an interval subsequent to said one interval to the accumulated energy of said one interval.

10. The apparatus of claim 8, and further comprising a data adaptive threshold generator operable to select a peak temporal energy value from one of a selected plurality of temporal energy samples transmitted from said filter, said threshold generator operable to determine a temporal energy threshold as a function of said peak energy value and to communicate said threshold to said time-domain test template generator.

11. The apparatus of claim 2, wherein said frequency-domain test template generator includes a plurality of counters operable to count numbers of times that spectral energy signals exceed at least one spectral energy signal threshold, each counter operable to store a sum of counts for each frequency bin.

12. The apparatus of claim 11, and further comprising a data-adaptive threshold generator for generating at least one spectral energy signal threshold as a function of a peak temporal energy value selected from a plurality of said temporal energy samples transmitted by said filter, said threshold generator coupled to said frequency-domain test template generator for transmitting said spectral energy signal threshold thereto.

13. The apparatus of claim 2, wherein said analyzer includes a reference template generator for generating a frequency-domain reference template for comparison to said frequency-domain test template.

14. The apparatus of claim 2, wherein said analyzer includes a reference template storer for storing a plurality of preprogrammed acceptable time-domain reference ratios for comparison to time-domain test templates.

15. The apparatus of claim 2, wherein said analyzer includes a tone purity checker operable to reject a set of received time and frequency-domain test templates if more than an acceptable calculated number of counts occur in each of a plurality of frequency bins.

16. The apparatus of claim 15, wherein said analyzer further includes a noise energy tester operable to sum the counts present in each frequency bin other than a peak frequency bin, and operable to reject said input signal if said sum exceeds an acceptable calculated threshold.

17. The apparatus of claim 2, wherein said analyzer includes a data-adaptive noise floor generator for generating a frequency-domain noise floor as a function of the highest accumulated spectral energy signal, said analyzer operable to reject said test templates if more than one of said spectral energy signals exceeds said noise floor.

18. A dual-tone multi-frequency (DTMF) receiver, comprising:
- a low-group digital bandpass filter and a high-group digital bandpass filter, each digital bandpass filter having a plurality of frequency bins, each bin corresponding to a standard DTMF audio frequency, each frequency bin having a recursive second-order transfer function for preferentially transmitting frequencies from an input signal near the respective standard frequency, each frequency bin accumulating, for each of a plurality of sampling periods, respective spectral energy signals and a temporal energy signal from said preferentially transmitted frequencies;
- a low-group time-domain test template generator and a high-group time-domain test template generator, each time-domain test template generator coupled to a respective bandpass filter for receiving a respective temporal energy signal for each of a plurality of said sampling periods and generating a time test template in response thereto;
- a low-group frequency-domain test template generator and a high-group frequency-domain test template generator coupled to said respective bandpass filters for receiving said respective spectral energy signals for each of a plurality of said sampling periods and respectively generating a low-group frequency test template and a high-group frequency test template in response thereto;
- a data-adaptive threshold generator for receiving said low-group temporal energy signal and said high-group temporal energy signal for a plurality of sampling periods and selecting a low-group peak energy value and a high-group peak energy value therefrom, said high-group peak energy value used to generate a high-group frequency-domain threshold, said low-group peak energy value used to generate a low-group frequency-domain threshold, the lesser of said peak energy values used to generate a time-domain threshold for both the high-group and low-group filters;
- said time-domain test template generators each operable to accumulate said temporal energy signals for each of a plurality of adjacent intervals, each interval comprising a plurality of sampling periods, each said frequency-domain test template generator operable to count the number of times that said spectral energy signals exceed respective frequency bin thresholds for each of said frequencies; and
- an analyzer coupled to said time-domain test template generators and to said frequency-domain test template generators for comparing said test templates to a plurality of time- and frequency-domain reference templates, said analyzer indicating a valid DTMF signal upon a sufficient match to respective reference templates for the low group and upon a sufficient match to respective reference templates for the high group.

19. The dual-tone multifrequency receiver of claim 18, and further comprising:
- a subsampler for intentionally aliasing a speech component in an input signal while retaining the integrity of a DTMF component of said input signal, output of said subsampler coupled to said bandpass filters for transmitting a subsampled input signal thereto.

20. A method for recognizing a pattern in an input signal, comprising the steps of:
   generating a temporal energy signal and a plurality of spectral energy signals for each of a plurality of sampling periods in response to receiving an input signal;
   generating a time-domain test template in response to a plurality of the temporal energy signals;
   generating a frequency-domain test template in response to a plurality of the spectral energy signals;
   comparing the time-domain test template to at least one time-domain reference template;
   comparing the frequency-domain test template to at least one frequency-domain reference template; and
   recognizing a pattern upon a predetermined degree of match between the test templates and the respective reference templates.

21. A method for detecting a dual-tone multi-frequency signal, comprising the steps of:
   filtering an input signal to preferentially transmit spectral components thereof near each of a plurality of preselected frequencies;
   generating a plurality of temporal energy signals for each of a plurality of sampling periods as a function of all of said transmitted spectral components;
   generating a plurality of spectral bin energy signals, one for each spectral component, for each of said sampling periods;
   generating time-domain test templates in response to said temporal energy signals, said templates covering a plurality of said sampling periods;
   generating frequency-domain test templates in response to said spectral energy signals, said frequency-domain templates covering a plurality of said sampling periods; and
   recognizing the presence or absence of a valid dual-tone multi-frequency signal in response to said test templates.

22. The method of claim 21, wherein said step of filtering the input signal comprises submitting the input signal in parallel to each of a plurality of frequency bins, and
   in each bin, filtering the input signal according to a recursive second-order transfer function.

23. The method of claim 22, wherein said step of filtering the input signal comprises applying a transfer function of the form:

$$H(z) = \frac{1 - e^{-aT}\cos bT z^{-1}}{1 - 2e^{-aT}\cos bT z^{-1} + e^{-2aT}z^{-2}}$$

to the input signal for each of said frequency bins, wherein a is half of the bandwidth of the respective frequency bin, b is the center frequency of the respective frequency bin, T is the length of each sampling period and $e^{-aT}$ is the pole radius of each complex pole pair.

24. The method of claim 21, and further comprising the step of inputting the input signal to each of a low bandpass filter and a high bandpass filter for selectively filtering frequency components near or at each of four predetermined frequencies per bandpass filter.

25. The method of claim 21, and further comprising the step of accumulating the temporal energy signals for each of the intervals to generate the time-domain test templates.

26. The method of claim 25, and further comprising the step of generating at least one time-domain reference template based on:
   a set of known intermember ratios of the members of a time-domain template representing a predetermined acceptable transient bandpass filter response; and
   said time-domain test template.

27. The method of claim 21, wherein said step of generating the frequency-domain test templates comprises the step of counting numbers of times that the magnitudes of said spectral energy signals exceed a calculated threshold for each group to produce a number of counts for each of the spectral components.

28. The method of claim 27, and further comprising the step of generating the threshold for each group as a function of the peak of said temporal energy signals over a plurality of sampling periods.

29. The method of claim 27, and further comprising the step of generating a plurality of frequency-domain reference templates as a function of the maximum count in each of the test templates over a plurality of sampling periods.

30. The method of claim 21, and further comprising the step of rejecting the time domain and frequency-domain test templates if an acceptable calculated number of counts is exceeded for more than one spectral component bin per frequency-domain test template.

31. The method of claim 21, wherein said step of generating the time-domain test templates further comprises the step of accumulating the temporal energy signals in each of a plurality of adjacent intervals, each interval including a plurality of sampling periods.

32. The method of claim 31, and further comprising the step of detecting an inter-digit pause when the temporal energy signals have decayed below a computed data-adaptive threshold.

33. The method of claim 31, and further comprising the steps of:
   storing a plurality of intermember reference ratios predetermined from the members of a time-domain template corresponding to an acceptable transient bandpass filter response;
   generating a time-domain reference template based on said stored reference ratios and one of said time-domain test templates; and
   comparing the time-domain reference template to the time-domain test template in determining whether a valid dual-tone multi-frequency signal is present.

* * * * *